US011650231B2

(12) United States Patent
Zhao et al.

(10) Patent No.: US 11,650,231 B2
(45) Date of Patent: May 16, 2023

(54) ON RESISTANCE CURRENT SENSING FOR POWER CONVERSION DEVICES

(71) Applicant: Infineon Technologies Austria AG, Villach (AT)

(72) Inventors: Tao Zhao, Redondo Beach, CA (US); Pablo Yelamos Ruiz, Hermosa Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 16 days.

(21) Appl. No.: 17/348,068

(22) Filed: Jun. 15, 2021

(65) Prior Publication Data
US 2022/0397591 A1   Dec. 15, 2022

(51) Int. Cl.
G01R 19/22 (2006.01)
G01R 19/00 (2006.01)

(52) U.S. Cl.
CPC ......... G01R 19/0023 (2013.01); G01R 19/22 (2013.01)

(58) Field of Classification Search
CPC ...... H02M 1/0009; H02M 1/08; H02M 3/156; H02M 3/157; H02M 3/1588; H02M 3/1586; H02M 1/0025; H02M 3/33569; H02M 1/4241; H02M 3/33571; H02M 1/0032; H02M 1/4233; H02M 1/38; H02M 1/44; H02M 1/0029; H02M 1/12; H02M 7/219;

(Continued)

(56) References Cited

U.S. PATENT DOCUMENTS 6,653,812 B1 *  11/2003  Huo ................. H02M 7/53875
                                              363/40
8,169,806 B2 *   5/2012  Sims ..................... H02M 1/15
                                              323/284

(Continued)

FOREIGN PATENT DOCUMENTS

EP       1657557 A1    5/2006
KR    20160104774 A    9/2016

OTHER PUBLICATIONS

Wang, Chao-Min, et al., "A Simple Single Shunt Current Reconstruction Approach for Low-Cost Permanent Magnet Synchronous Motor Drives", Proceedings of 2015 International Automatic Control Conference (CACS); The Evergreen Resort Hotel (Iiaosi), Yilan, Taiwan, Nov. 18-20, 2015, pp. 79-84.

*Primary Examiner* — Vinh P Nguyen
(74) *Attorney, Agent, or Firm* — Murphy, Bilak & Homiller, PLLC

(57) ABSTRACT

A power conversion device includes: a plurality of legs, each leg including a high-side switch connected between a voltage supply node and a phase node and a low-side switch connected between the phase node and a reference node; a phase current sensor for each leg and configured to sense current flowing through the high-side switch or the low-side switch of the corresponding leg; a single current sensor connected between the reference node and the low-side switches, or between the voltage supply node and the high-side switches; and a controller. During a subperiod of a switching period, the controller is configured to sample the current sensed by at least one of the phase current sensors and a current sensed by the single current sensor such that the current in one or more of the legs is sampled during the same subperiod as the current flowing through the single current sensor.

25 Claims, 16 Drawing Sheets

(58) Field of Classification Search
CPC ...... H02M 1/096; H02M 1/084; H02M 1/123; H02M 7/5387; H02M 3/33546; H02M 1/15; H02M 3/33592; H02M 1/4258; H02M 3/3385; H02M 1/0043; H02M 1/008; H02M 3/33573; H02M 3/072; H02M 7/4835; H02M 7/53862; H02M 7/153; H02P 6/085; H02P 6/26; H02P 29/026; H02P 6/15; H02P 6/153; H02P 27/08; H02P 21/22; H02P 29/10; H02P 29/024; H02P 29/0241; G01R 19/0092; G01R 1/203; G01R 31/40; G01R 19/175; G01R 19/2513; G01R 19/0023; G01R 19/2506; G01R 19/32; G01R 1/206; G01R 19/2509; G01R 19/165; G01R 31/00; H03K 2217/0081; H03K 17/168; H03K 2217/0063; H03K 2217/0072; H03K 17/14; H03K 2217/0045

See application file for complete search history.

(56) References Cited

U.S. PATENT DOCUMENTS

| | | | | |
|---|---|---|---|---|
| 9,225,264 | B1 * | 12/2015 | Fedigan | H02M 7/53875 |
| 9,515,572 | B2 * | 12/2016 | Hirsch | H02P 29/68 |
| 9,843,273 | B2 * | 12/2017 | Fukumaru | H02M 7/5387 |
| 10,256,760 | B2 * | 4/2019 | Fukumaru | H02P 27/08 |
| 10,411,623 | B2 * | 9/2019 | Lee | H02P 6/18 |
| 10,418,894 | B2 * | 9/2019 | Kim | H02P 21/22 |
| 10,425,017 | B2 * | 9/2019 | Qian | H02M 7/537 |
| 11,411,524 | B2 * | 8/2022 | Yoo | B60L 3/003 |

* cited by examiner

ON RESISTANCE CURRENT SENSING FOR POWER CONVERSION DEVICES

BACKGROUND

Power conversion devices such as three-phase BLDC (brushless DC) and PMSM (permanent magnet synchronous motor) drive systems implement phase current sensing using shunt resistors located in the inverter low-side legs or by in-phase current sensing of the motor phases, e.g., three-shunt current sensing. In-phase shunt current sensing requires special current sense amplifiers with wide common-mode range and enhanced PWM (pulse width modulation) rejection. More shunt resistors in parallel are needed for high power applications, so for three-shunt current sensing, PCB (printed circuit board) size and bill of material cost increase significantly. Single shunt resistor current sensing is not suitable for motor control with large motor current variations within one PWM cycle and requires a high-speed and high-bandwidth amplifier for better performance.

For cost-sensitive applications, three-phase MOSFET (metal-oxide-semiconductor field-effect transistor) RDSon (drain-to-source on-state resistance) current sensing has been used to eliminate costly shunt resistors for battery powered applications such as e-Bike (electric bike), e-scooter (electric scooter), LEV (light electric vehicle), power tools, gardening tools, drones, etc. However, RDSon deviates from wafer to wafer and from part to part, and varies with temperature fluctuations. For example, RDSon can increase by 60% or more if the junction temperature (Tj) increases from 25° C. to 125° C. Compensation is needed to make RDSon current sensing accurate enough to meet stringent motor torque and speed control requirements.

Variations in RDSon have been addressed by selecting transistor devices with close RDSon values which requires time and effort, increasing overall system cost. Another solution uses an on-board temperature sensor/thermistor to monitor the board temperature and estimate RDSon values according to the relationship between RDSon and MOSFET junction temperature. However, accurate MOSFET junction temperature is difficult to obtain and can vary for different inverter phases due to different power losses and thermal designs. Accordingly, complex MOSFET loss calculations and thermal modelling are required to accurately predict junction temperature of all or individual MOSFETs, for better RDSon current sensing compensation or MOSFET diagnostic monitoring.

Thus, there is a need for an improved RDSon current sensing technique for power conversion devices.

SUMMARY

According to an embodiment of a power conversion device, the power conversion device comprises: a plurality of legs, each leg comprising a high-side switch connected between a voltage supply node and a phase node and a low-side switch connected between the phase node and a reference node; a phase current sensor for each leg and configured to sense current flowing through the high-side switch or the low-side switch of the corresponding leg; a single current sensor connected between the reference node and the low-side switches, or between the voltage supply node and the high-side switches; and a controller, wherein during a subperiod of a switching period, the controller is configured to sample the current sensed by at least one of the phase current sensors and a current sensed by the single current sensor such that the current in one or more of the legs is sampled during the same subperiod as the current flowing through the single current sensor.

According to an embodiment of a power electronic system, the power electronic system comprises: a multi-phase motor; and a power conversion device configured to drive the multi-phase motor. The power conversion device comprises: a plurality of legs, each leg comprising a high-side switch connected between a voltage supply node and a phase node coupled to the multi-phase motor and a low-side switch connected between the phase node and a reference node; a phase current sensor for each leg and configured to sense current flowing through the high-side switch or the low-side switch of the corresponding leg during operation of the multi-phase motor; a single current sensor connected between the reference node and the low-side switches, or between the voltage supply node and the high-side switches; and a controller, wherein during a subperiod of a switching period for driving the multi-phase motor, the controller is configured to sample the current sensed by at least one of the phase current sensors and a current sensed by the single current sensor such that the current in one or more of the legs is sampled during the same subperiod as the current flowing through the single current sensor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an RDSon current sensing technique for power conversion devices. The RDSon current sensing technique includes the use of a single current sensor for sensing DC-link current of a power conversion device and using the sensed DC-link current to compensate RDSon current sensing and/or to implement diagnostic monitoring of RDSon and/or transistor junction temperature. Any type of power conversion device may utilize the RDSon current sensing technique. The term 'power conversion device' as used herein includes any type of electrical device that converts AC to DC, inverts DC to AC or converts one DC voltage to another DC voltage. The RDSon current sensing technique may be used with multi-phase motor control techniques such as BLDC, PMSM, ACIM (AC induction motor), two-phase motor control, H-bridge motor control of brushed, brushless or stepper motor, H-bridge buck-boost converter, buck converter, boost converter, or other applications that require accurate current sensing. The RDSon current sensing technique is compatible with control algorithms such as sensorless or sensored FOC (Field-Oriented Control), sensorless or sensored DTC (Direct Torque Control), and sensorless or sensored BLDC block commutation control, as examples.

Described next with reference to the figures are embodiments of the RDSon current sensing technique, and corresponding power conversion devices, power electronic systems, and methods of RDSon current sensing compensation for power conversion devices.

Figure 1:
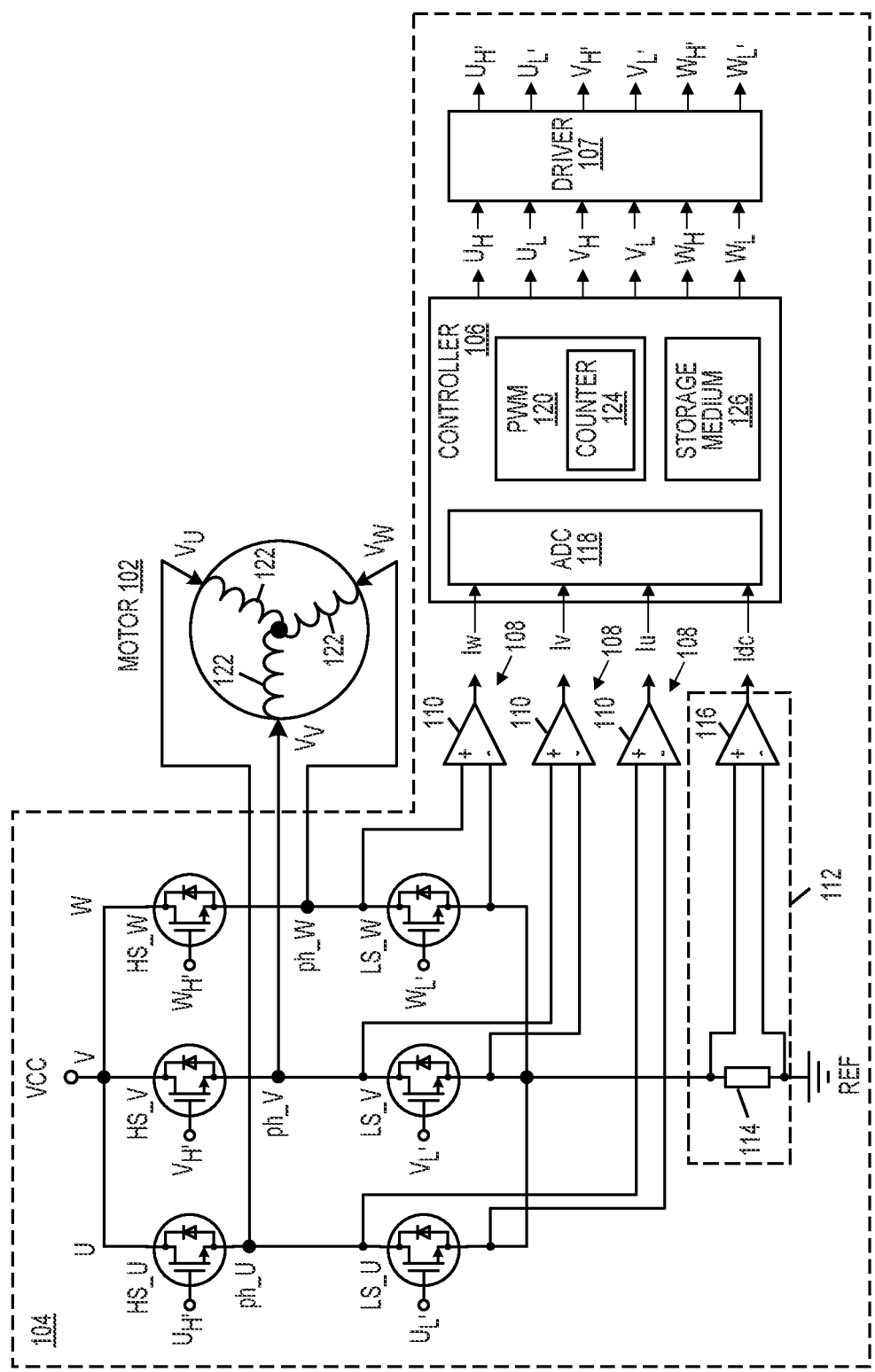
FIG. 1 illustrates a schematic diagram of an embodiment of a power electronic system that includes a multi-phase motor and a power conversion device that implements RDSon current sensing.

FIG. 1 illustrates an embodiment of a power electronic system 100 that includes a multi-phase motor 102 and a power conversion device 104. The power conversion device 104 drives the multi-phase motor 102 and incorporates the RDSon current sensing technique.

The power conversion device 104 has a plurality of legs (also referred to herein as phases) U, V, W. Each leg U, V, W includes a high-side switch HS_U, HS_V, HS_W connected between a voltage supply node VCC and a phase node ph_U, ph_V, ph_W coupled to the multi-phase motor 102, and a low-side switch LS_U, LS_V, LS_W connected between the phase node ph_U, ph_V, ph_W and a reference node REF such as ground. The high-side switches HS_U, HS_V, HS_W and the low-side switches LS_U, LS_V, LS_W included in the legs U, V, W of the power conversion device 104 can be MOSFETs, HEMTs (high electron mobility transistors), or other types of power FETs, or even IGBTs (insulated gate bipolar transistors). In the case of an IGBT, RDSon current sensing is not applicable but the techniques described herein may be used to measure the collector-emitter voltage and collector current of an IGBT and use these measured parameters to calculate and monitor the junction temperature of the IGBT. Each switch HS_U, HS_V, HS_W, LS_U, LS_V, LS_W may be implemented as a single transistor device or by paralleling 2 or more transistor devices, depending on the type of switches used and the expected load current of the multi-phase motor 102.

Each phase node phU, ph_V, ph_W of the power conversion device 104 provides a voltage $V_U$, $V_V$, $V_W$ and corresponding phase current to the respective winding 122 of the multi-phase motor 102. In the multi-phase motor example illustrated in FIG. 1, the motor 102 has 3 windings 122. In general, the multi-phase motor 102 may have 2 windings 122, 3 windings 122, or more than 3 windings 122.

The power conversion device 104 further includes a controller 106 that controls the on/off state of each switch HS_U, HS_V, HS_W, LS_U, LS_V, LS_W included in the legs U, V, W of the power conversion device 104 through corresponding gate driver circuitry 107, thereby controlling the stator/phase currents in the multi-phase motor 102. The controller 104 may be a microcontroller, a CPU (central processing unit), a digital signal processor (DSP), an ASIC (application-specific integrated circuit), or any other type of digital and/or analog circuit capable of controlling the on/off state of the switches HS_U, HS_V, HS_W, LS_U, LS_V, LS_W included in the legs U, V, W of the power conversion device 104.

The power conversion device 104 also includes a phase current sensor 108 for each leg U, V, W of the power conversion device 104. Each phase current sensor 108 is configured to sense current flowing through the high-side switch HS_U, HS_V, HS_W or the low-side switch LS_U, LS_V, LS_W of the corresponding leg U, V, W during operation of the multi-phase motor 102. In one embodiment, each phase current sensor 108 includes an amplifier 110 coupled across the drain and source of the corresponding switch HS_U/LS_U, HS_V/LS_V, HS_W/LS_W, for implementing RDSon current sensing. As shown in FIG. 1, each phase current sensor 108 senses the RDSon current flowing through the low-side switch LS_U, LS_V, LS_W of the corresponding leg U, V, W when that switch is on.

The power conversion device 104 also includes a single current sensor 112 connected between the reference node REF and the low-side switches LS_U, LS_V, LS_W, or between the voltage supply node VCC and the high-side switches HS_U, HS_V, HS_W. As shown in FIG. 1, the single current sensor 112 is connected between the reference node REF and the low-side switches LS_U, LS_V, LS_W. The single current sensor 112 senses the same current flowing through the RDSon of at least one of the switches LS_U, LS_V, LS_W, HS_U, HS_V, HS_W, as described in more detail later herein. The single current sensor 112 may include any type of suitable current sensing element 114 for sensing a DC link current such as a shunt resistor, a Hall-effect current sensor, current transducer, etc., and an amplifier 116 coupled across the current sensing element 114.

The sensed phase currents Iw, Iv, Iu and the sensed DC link current Idc output by the amplifiers 110, 116 of the respective current sensors 108, 112 are sampled by the controller 106, e.g., by ADC (analog-to-digital converter) circuitry 118 included in the controller 106. The current sensor amplifiers 110, 116 may have fixed or variable/adjustable gains, with the same gain or different gains from each other. The outputs of the current sensor amplifiers 110, 116 may be biased to a certain voltage (e.g., 2.5V for 5V ADC reference) for bi-directional current sensing at the ADC circuitry 118 of the controller 106.

The controller 106 may use the sampled phase and DC link current information to compensate the RDSon current sensing and/or to implement diagnostic monitoring of RDSon and/or transistor junction temperature. In one embodiment, during a subperiod of a switching period for driving the multi-phase motor 102, the controller 106 samples the phase current Iw, Iv, Iu sensed by at least one of the phase current sensors 108 and the DC link current Idc sensed by the single current sensor 112 such that the current in one or more of the legs U, V, W is sampled during the same subperiod as the current flowing through the single current sensor 112.

The DC link current Idc sensed by the single current sensor 112 is highly accurate and can be used to compensate for less accurate RDSon current sensing provided by the phase current sensors 108. For example, in the case of a shunt resistor as the current sensing element 114 of the single current sensor 112, the shunt resistor may have a low resistance, e.g., in a range of 0.5 to 1 milliohm with very low tolerance, e.g., resistance tolerance of +/−1.0% and component temperature coefficient of +/−75 ppm/° C. where ppm is parts-per-million. Two or more shunt resistors in parallel instead of a single shunt resistor may be used for high power applications. In either case, the voltage output of the single current sensor amplifier 116 is proportional to the current flowing through the shunt resistor and more accurate than the RDSon current sensing since the voltage output of the phase current sensor amplifiers 110 is affected by RDSon variations which do not affect the voltage output of the single current sensor amplifier 116.

Accordingly, the controller 106 may use the DC link current Idc sensed by the single current sensor 112 and sampled by the ADC circuitry 118 to compensate the less accurate RDSon current sensing. In combination or alternatively, the controller 106 may use the DC link current Idc sensed by the single current sensor 112 and sampled by the ADC circuitry 118 to perform diagnostic monitoring of one or more of the low-side switches LS_U, LS_V, LS_W and/or one or more of the high-side switches HS_U, HS_V, HS_W. For example, the controller 106 may perform diagnostic monitoring of RDSon and/or junction temperature for one or more of the switches LS_U, LS_V, LS_W, HS_U, HS_V, HS_W. In combination or alternatively, the controller 106 may filter the DC link current Idc sensed by the single current sensor 112, e.g., by an RC LPF (low-pass filter) and/or the voltage output of the single current sensor amplifier 116 may be input to another ADC pin of the controller 106 for monitoring the current or average current of the motor phase(s), DC-link, battery, etc. and/or for motor control and system protection.

The RDSon current sensing technique is described next in more detail with reference to FIG. 2, which illustrates a reference vector approximation of a voltage space vector in SVM (Space Vector Modulation). SVM is one example of an algorithm that can be implemented by the controller 106 for controlling PWM (pulse width modulation) 120 applied to the switches LS_U, LS_V, LS_W, HS_U, HS_V, HS_W of the legs U, V, W of the power conversion device 104, to create multi-phase sinusoidal waveform inputs to the windings 122 of the multi-phase motor 102. The reference vector approximation in SVM shown in the space vector diagram of FIG. 2 includes a regular hexagon with sectors A to F. The voltage space vector, which is located in sector A in FIG. 2 as an example, has magnitude of $|V_{ref}|$ and angle of e and revolves at angular speed ω. The RDSon compensation implemented by the controller 106 is very similar for different SVM-based PWM patterns, such as 7-segment SVM-based PWM, 5-segment SVM-based PWM, 3-segment SVM-based PWM, phase shift PWM based on 7, 5, 3-segment SVM PWM, and any other SVM-based PWM patterns.

Figure 3:
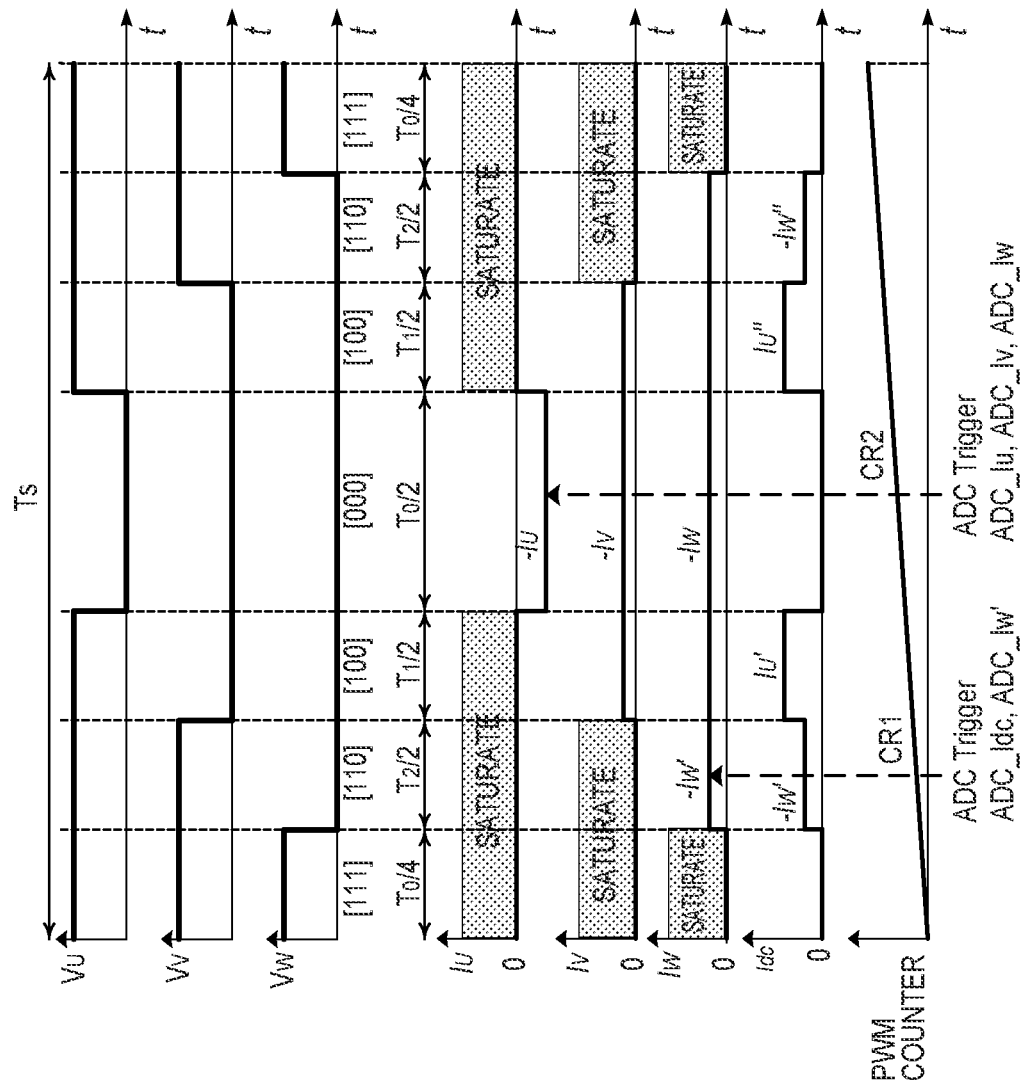
FIG. 3 illustrates a waveform diagram of the RDSon compensation implemented by the controller of the power conversion device for an example of 7-segment SVM-based PWM.

FIG. 3 illustrates the RDSon compensation implemented by the controller 106 for 7-segment SVM-based PWM, as an example. SVM defines a plurality of switching and zero voltage vectors. For 7-segment SVM, the switching voltage vectors correspond to SVM switching states [100], [110], [010], [011], [001] and [101] and the zero voltage vectors correspond to SVM switching states [000] and [111]. Each switching voltage vector defines a state in which the output voltage of the power conversion device 104 has non-zero magnitude and phase. The zero voltage vectors defines a state in which the output voltage of the power conversion device 104 has zero magnitude and phase. The controller 106 samples the currents sensed by at least one of the phase current sensors 108 and by the single current sensor 112 during one or more of the SVM switching states of a PWM switching period.

One PWM switching period (Ts) in SVM sector A is shown in FIG. 3, e.g., Ts=50 μs for 20 kHz PWM. When one of the phase nodes ph_U, ph_V, ph_W is low with the corresponding low-side switch LS_U, LS_V, LS_W on (conducting), the amplifier 110 of the phase current sensor 110 coupled to that low-side switch outputs useful voltage information Iu/Iv/Iw. Otherwise, the amplifier 110 would be saturated with the corresponding high-side switch HS_U, HS_V, HS_W being on. Multi-phase motor current sampling may be done at or near the center of SVM switching state [000] through RDSon current sensing, and synchronous ADC sampling and/or ADC conversion may be implemented by the controller 106 to provide optimal current sensing and motor control performance. To implement the phase current samplings and conversions at a precise time, a PWM counter 124 may be used and the values of a corresponding PWM compare register 1 (CR1) and compare register 2 (CR2) may be adjusted accordingly to trigger the ADC samplings and conversions.

The amplifier 116 of the single current sensor 112 outputs useful voltage information for the DC-link current when the SVM switching state is not [000] or [111]. For the example shown in FIG. 3, the low-side switch LS_W of leg W is on and the high-side switch HS_W of leg W is off during subperiod $T_2/2$ of the switching period Ts which corresponds SVM switching state [110]. The low-side switches LS_U, LS_V of legs U, V are off and the high-side switches HS_U, HS_V of legs U, V are on during the subperiod $T_2/2$ of the switching period Ts that corresponds SVM switching state [110]. The current sense amplifier 110 for leg W and the amplifier 116 of the single current sensor 112 amplify the same motor current −Iw' in SVM switching state [110] on the left-hand side where the ADC samplings and conversions are triggered at CR1, which can also be done in the SVM switching state [110] on the right-side side. The current sense amplifier 110 for leg W is affected by RDSon variations of low-side switch LS_W, but the output of the amplifier 116 of the single current sensor 112 is accurate.

The controller 106 calculates a compensation factor for leg W based on the currents sampled during the subperiod $T_2/2$ corresponding to SVM switching state [110]. The controller 106 may calculate the compensation factor as a single point calculation, over several consecutive switching periods Ts, and/or based on a plurality of sample points. For example, the controller 106 may apply a moving average or a digital filter to the plurality of sample points to calculate the compensation factor. Calculating the compensation factor over several consecutive switching periods Ts and/or based on a plurality of sample points may improve the accuracy of the compensation factor, particularly for low current levels (e.g., in a range of 1 to 5 A) and when the ADC circuitry 118 is configured to have a 0.5 A/LSB, where 'LSB' means least significant bit. In such cases, the measurement resolution may not be sufficient and prone to large percentage deviations when using a single point measurement, the usage of post-processing may help fine tune the compensation factor.

In one embodiment, the ratio of the ADC values for Idc and Iw are used to calculate the compensation factor CF_W for leg W, e.g., as Idc/Iw or Iw/Idc. The controller 106 may use the compensation factor CF_W to compensate the RDSon current sensed by the phase current sensor 108 for leg W and triggered at CR2 which is at or near to the center of subperiod $T_0/2$ which corresponds to SVM switching state [000], to mitigate the effect of RDSon variations in the low-side switch LS_W for leg W. The RDSon compensation technique as applied to leg W may be expressed by equations (1) and (2) below, after factoring out amplifier gains and biases.

$$Iw_{compensated} = Iw(CR2) \times CF\_W = Iw \times \frac{Idc(CR1)}{Iw(CR1)} \quad (2)$$

Additional considerations may be taken into account to yield the optimal RDSon compensation at the lowest cost. For example, the ADC circuitry 118 of the controller 106 may sample Idc and Iw when the time window of the subperiod $T_2/2$ corresponding to SVM switching state [110] is wide enough such that a standard amplifier and not a high-speed or high-bandwidth amplifier may be used for the amplifier 116 of the single current sensor 112, and which also avoids the noise at the PWM switching edges. That is, the controller 106 may sample the currents sensed by at least one of the phase current sensors 108 and by the single current sensor 112 during a switching state of a switching period having a window size that exceeds a predefined minimum size. Otherwise, current sensing may be skipped for a particular subperiod/SVM switching state if the window size for that subperiod/switching state is too small.

Synchronous ADC sampling and/or ADC conversion for Idc and Iw may be implemented by the controller 106. The ADC circuitry 118 of the controller 106 may discard the compensation factor if the ADC values are too small, e.g., if the ratio of Idc/Iw (or Iw/Idc) taken at CR1 in the subperiod $T_2/2$ corresponding to SVM switching state [110] is not accurate. Instead, the controller 106 may use the previous accurate compensation factor until a new accurate compensation factor is available. That is, during a subsequent switching period Ts, the controller 106 may sample a phase current for one of the legs U, V, W using the corresponding phase current sensor 108 and adjust the sampled phase current based on the corresponding compensation factor calculated during a previous switching period Ts.

If the ADC circuitry 118 included in the controller 106 has a plurality of sampling units, the controller 106 may simultaneously sample the current Iw, Iu, Iv sensed by at least one of the phase current sensors 108 and the current Idc sensed by the single current sensor 112 during the same subperiod by using the plurality of sampling units. For the 7-segment SVM example illustrated in FIG. 3, this means that the controller 106 may simultaneously sample Iw and Idc at CR1 using the plurality of sampling units. If, however, the ADC circuitry 118 of the controller 106 includes a single sampling unit, the controller 106 instead successively samples Iw and Idc at different times (e.g., Iw sampled at CR1 and Idc sampled at CR1+Δt) but still during the same subperiod $T_2/2$ corresponding to SVM switching state [110] using the single sampling unit.

In addition to or separately from the RDSon compensation, the controller 106 may use the compensation factor for diagnostic monitoring of the switch HS_U, HS_V, HS_W, LS_U, LS_V, LS_W connected to the phase current sensor 108 that sampled current during the switching subperiod of interest. As indicted by equation (1), the compensation factor CF may be calculated as the ratio of shunt resistance and switch RDSon during the same subperiod. The shunt resistance is accurate, so the controller 106 may use the compensation factor as an indicator of RDSon or to calculate RDSon.

Separately or in combination, the controller 106 may calculate the individual junction temperature Tj of the switch HS_U, HS_V, HS_W, LS_U, LS_V, LS_W connected to the phase current sensor 108 that sampled current during the switching subperiod of interest, based on the relationship between RDSon and Tj. For example, the controller 106 may include a storage medium 126 such as a memory, look-up table, specific coefficients (parameters) of the curve fitting equation(s) for the relationship of Tj and RDSon, etc. that stores a predefined relationship between on-state resistance (RDSon) and junction temperature (Tj). Separately or in combination, the storage medium 126 may also store the calculated values of on-state resistance (RDSon) and junction temperature (Tj) of the switches for diagnostic monitoring and analysis.

The predefined relationship between RDSon and Tj may be preloaded into the storage medium 126 of the controller 106. The storage medium 126 may be accessible via a cloud service, e.g., via a secure connection such as BLE (Bluetooth low energy), Wifi, serial communication, etc. for programming and/or updating the predefined relationship between RDSon and Tj. The controller 106 may calculate Tj of the switch HS_U, HS_V, HS_W, LS_U, LS_V, LS_W connected to the phase current sensor 108 that sampled current during a switching subperiod of interest, based on the calculated RDSon and the predefined relationship between RDSon and Tj stored in the storage medium 126.

Figure 4:
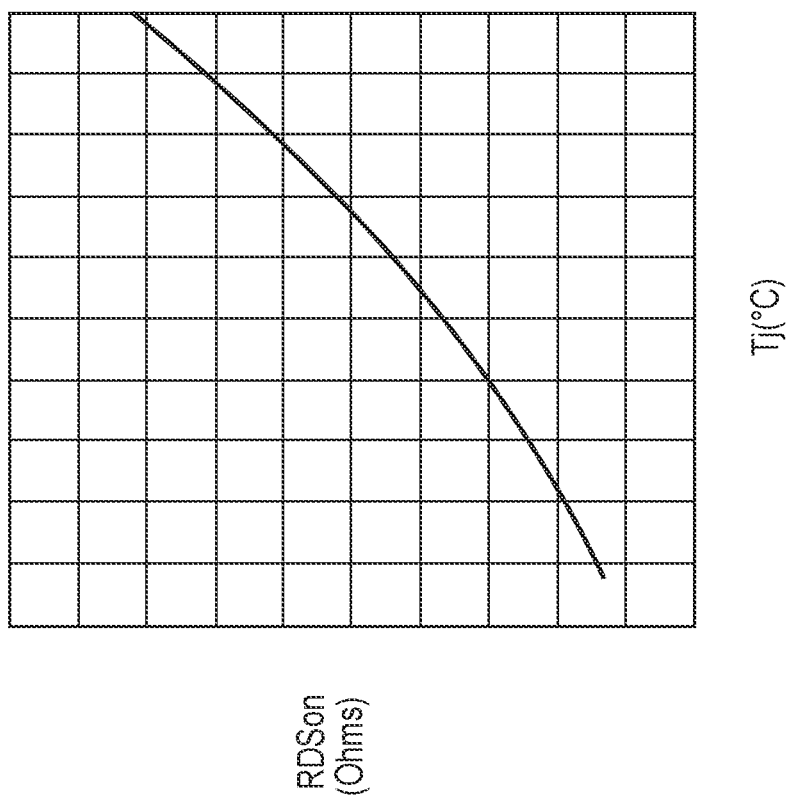
FIG. 4 illustrates a plot of the relationship between RDSon and junction temperature for a transistor switch device.

Separately or in combination, the controller 106 may take one or more corrective actions responsive to the calculated on-state resistance RDSon or responsive to the calculated junction temperature Tj exceeding one or more corresponding thresholds. For example, if RDSon and/or Tj are too high due to high power loss or device damage/defect, the system 100 may take appropriate action, e.g., by reducing the output power of the power conversion device 104, reducing motor torque or speed, shutting down the system 100, etc. The relationship between RDSon and Tj is a monotonically increasing function, as shown in FIG. 4. Accordingly, the controller 106 may diagnostically monitor RDSon instead of Tj. Separately or in combination, multiple thresholds with hysteresis may be used.

FIG. 3 illustrates RDSon current sensing for leg W. In general, the controller 106 may determine a compensation factor based on the currents sampled during one, some or all of the switching states of a switching period.

Figure 2:
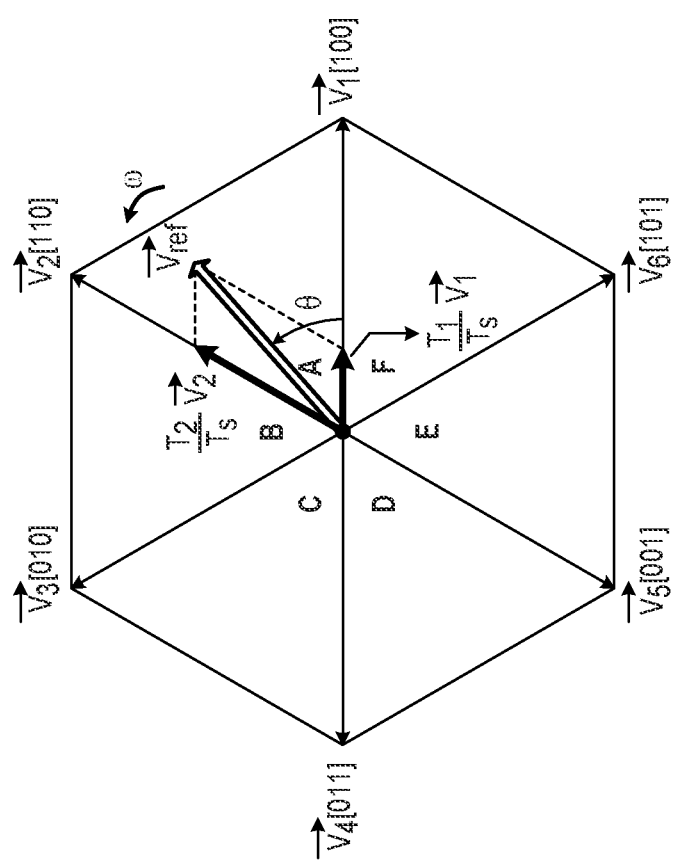
FIG. 2 illustrates a reference vector approximation of a voltage space vector in SVM (Space Vector Modulation).
Figure 5:
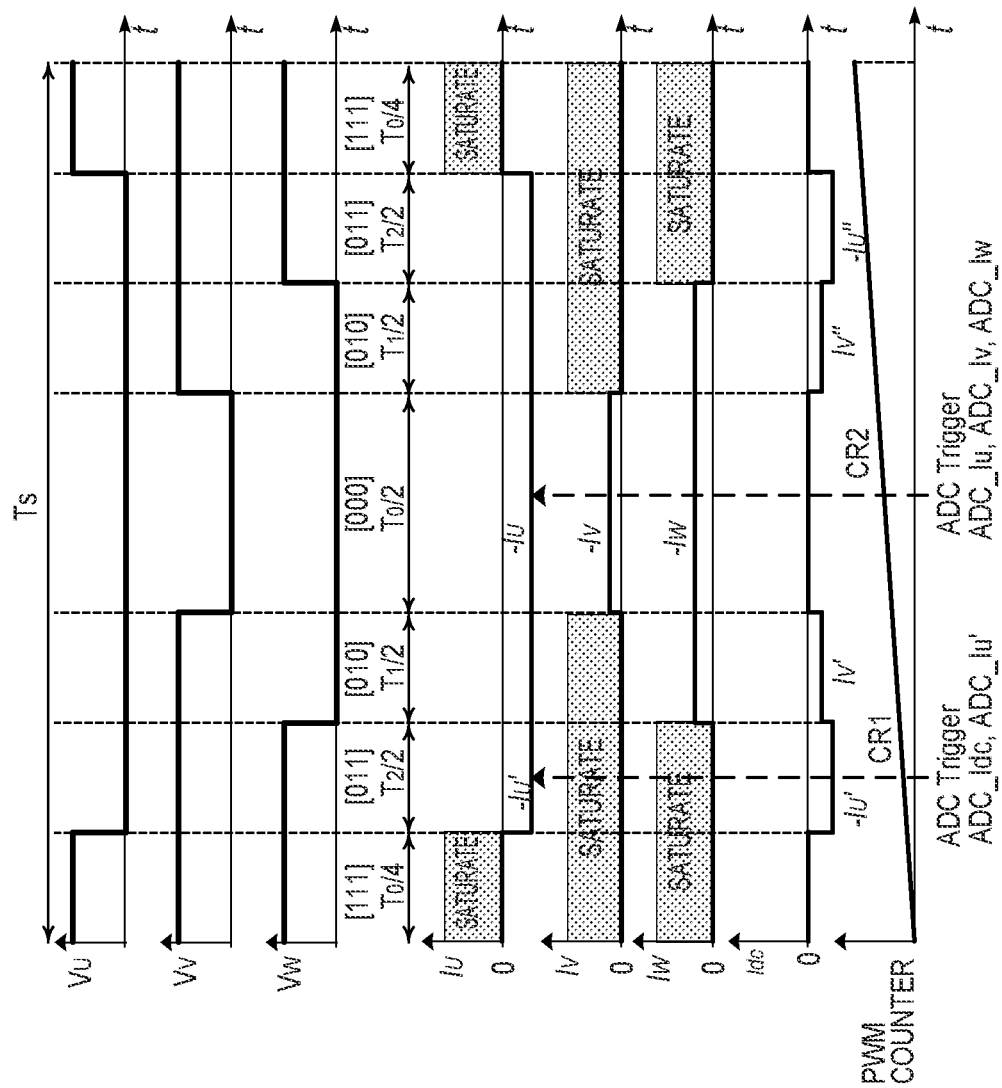
FIG. 5 illustrates a waveform diagram of the RDSon compensation implemented by the controller of the power conversion device of FIG. 1 for 7-segment SVM-based PWM in SVM sector C shown in FIG. 2, as another example.

FIG. 5 shows the 7-segment SVM switching and zero voltage vectors for one PWM switching period in SVM sector C shown in FIG. 2, as another example. The example shown in FIG. 5 is similar to the example shown in FIG. 3. Different, however, the ADC values Idc/Iu (or Iu/Idc) sampled during subperiod $T_2/2$ that corresponds to SVM switching state [011] are used as the compensation factor for compensating RDSon variations in leg U and/or to implement diagnostic monitoring of the RDSon and/or junction temperature in leg U. Similar compensation factor calculations may be performed for the other SVM sectors B, D, E and F shown in FIG. 2.

Table 1 lists the phases of RDSon compensation and diagnostic monitoring at different SVM sectors. When the voltage space vector rotates from sector A to F (or from F to A in another direction), RDSon of all legs U, V and W can be compensated within one electrical revolution. The compensation and diagnostic monitoring continue periodically as the motor 102 rotates, or only at certain time slots selected by the user.

TABLE 1

Phases of RDS(on) compensation and diagnostic monitoring at different SVM sectors

| SVM sector | RDSon to compensate and monitor |
| --- | --- |
| A, B | Phase W |
| C, D | Phase U |
| E, F | Phase V |

Figure 6:
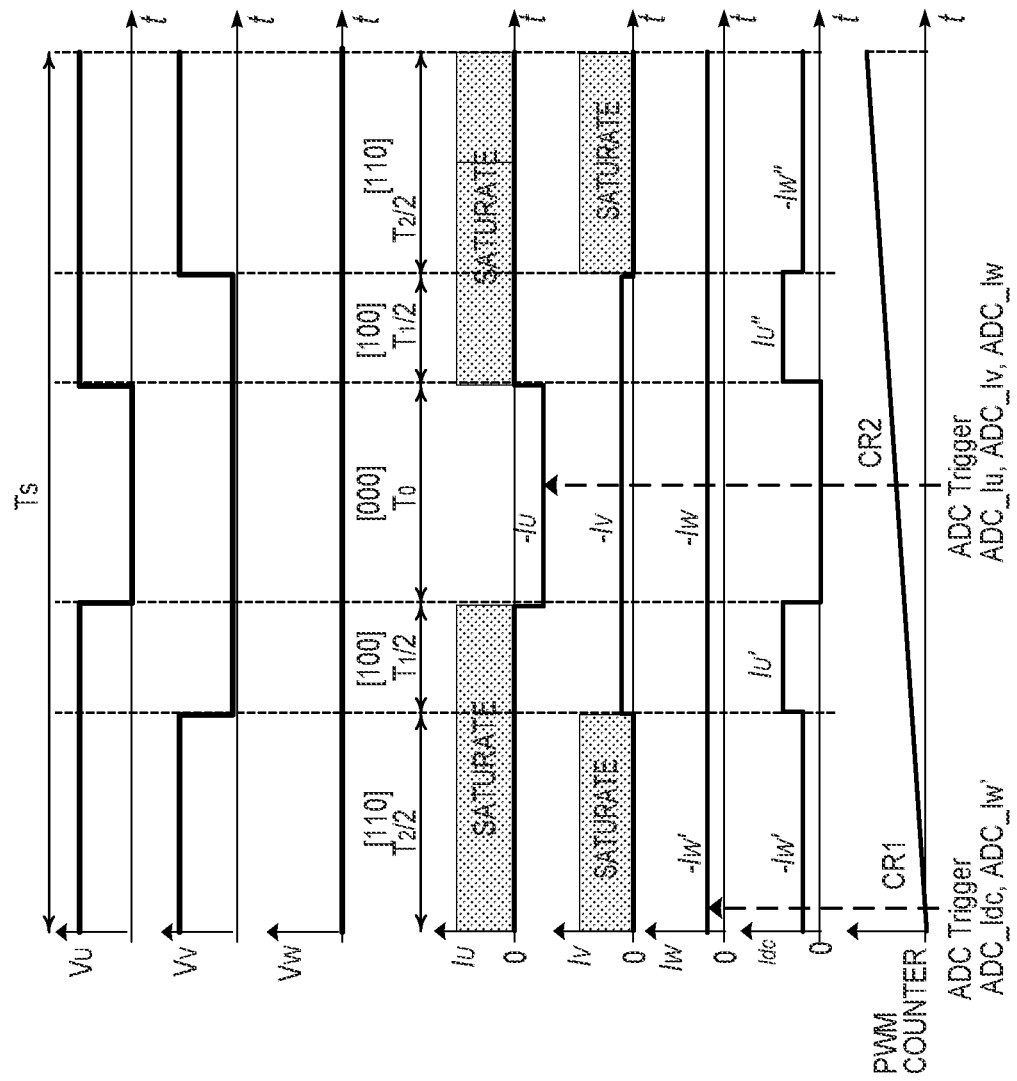
FIG. 6 illustrates a waveform diagram of the RDSon compensation implemented by the controller of the power conversion device of FIG. 1 for 5-segment SVM-based PWM control in SVM sector A, as another example.
Figure 7:
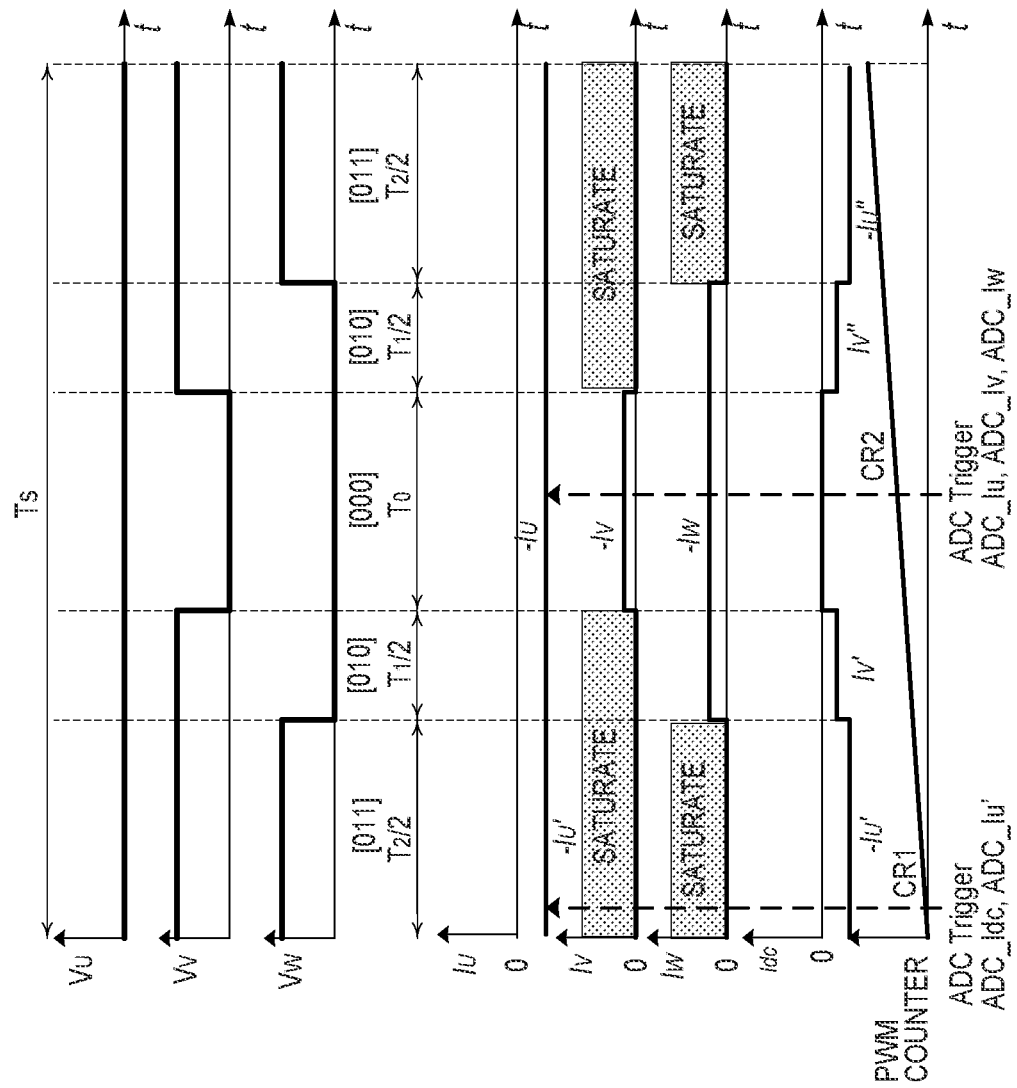
FIG. 7 illustrates a waveform diagram of the RDSon compensation implemented by the controller of the power conversion device of FIG. 1 for 5-segment SVM-based PWM in SVM sector C, as another example.

FIG. 6 illustrates the RDSon compensation implemented by the controller 106 for 5-segment SVM-based PWM in SVM sector A and FIG. 7 illustrates the RDSon compensation implemented by the controller 106 for 5-segment SVM-based PWM in SVM sector C, as additional examples. The RDSon current sensing compensation and monitoring of RDSon and/or junction temperature are similar to the description provided above for FIG. 3 and as indicated in Table 1.

In FIG. 6, 5-segment SVM-based PWM is implemented by the controller 106 and current sense amplifier 110 for leg W and the amplifier 116 of the single current sensor 112 amplify the same motor current −Iw' in subperiod $T_2/2$ corresponding to SVM switching state [110] on the left-hand side, enabling the controller 106 to compensate and monitor RDSon for leg W. In FIG. 7, 5-segment SVM-based PWM is implemented by the controller 106 and current sense amplifier 110 for leg U and the amplifier 116 of the single current sensor 112 amplify the same motor current −Iu' in subperiod $T_2/2$ corresponding to SVM switching state [011] on the left-hand side, enabling the controller 106 to compensate and monitor RDSon for leg U.

Further embodiments for implementing the RDSon current sensing technique are described next. The RDSon current sensing may be implemented at just low-side switches LS_U, LS_V, LS_W, just the high-side switches HS_U, HS_V, HS_W, a combination of the low-side and high-side switches LS_U, LS_V, LS_W, HS_U, HS_V, HS_W, or at all low-side and high-side switches LS_U, LS_V, LS_W, HS_U, HS_V, HS_W. The low-side and high-side switches LS_U, LS_V, LS_W, HS_U, HS_V, HS_W may be n-channel MOSFETs, p-channel MOSFETs, mixed, etc. The single current sensor 112 may be at the high-side or low-side of the DC-link.

Figure 8:
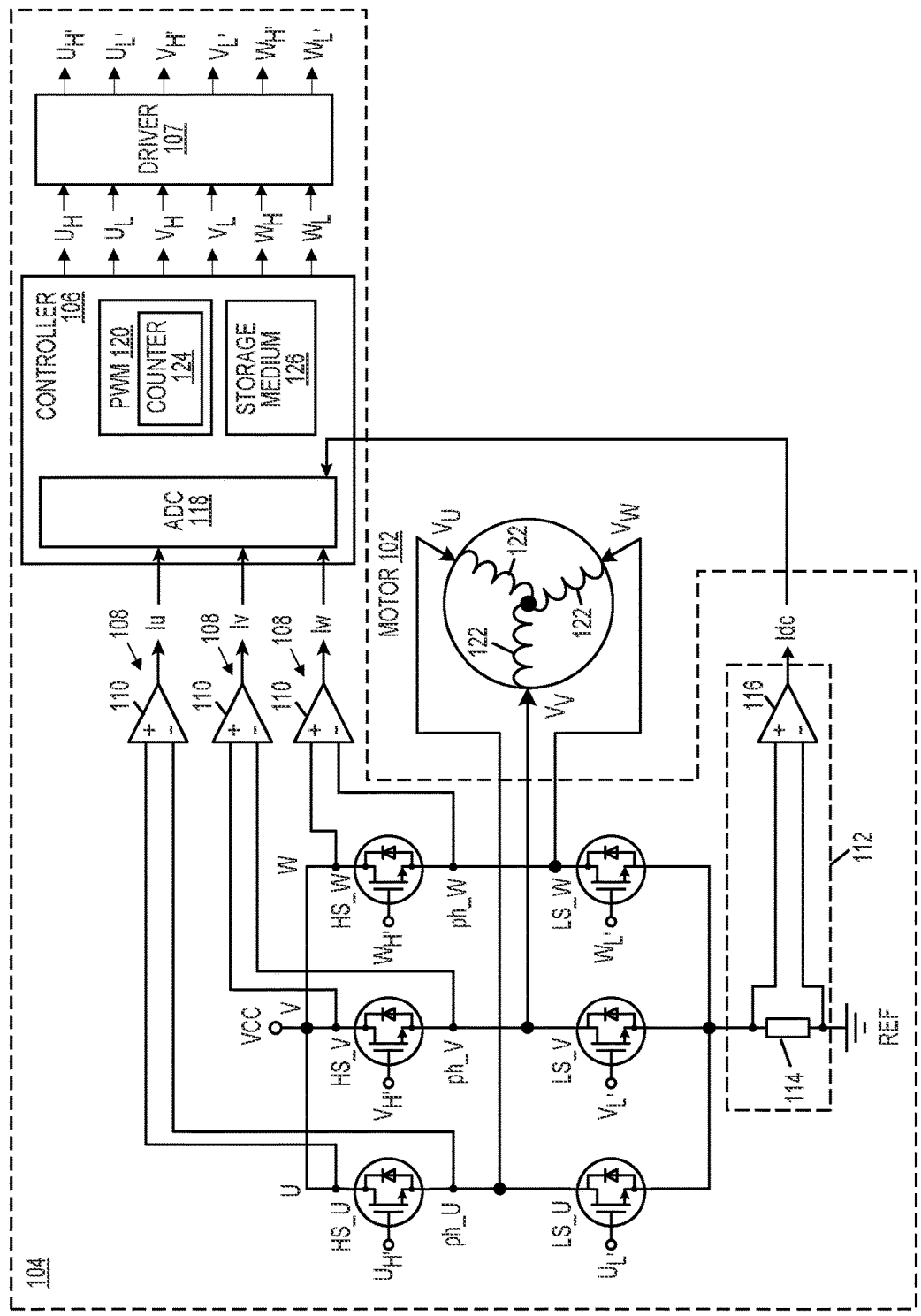
FIG. 8 illustrates a schematic diagram of an embodiment of a power electronic system that includes a multi-phase motor and a power conversion device that implements RDSon current sensing, according to another embodiment.

FIG. 8 illustrates another embodiment of the power electronic system 100. According to this embodiment, RDSon current sensing is implemented at the high-side switches HS_U, HS_V, HS_W and the single current sensor 112 is connected between the reference node REF and the low-side switches LS_U, LS_V, LS_W. When one of the high-side switches HS_U, HS_V, HS_W is on, that switch outputs a voltage signal that is proportional to the current flowing into that phase of the motor 102. The low-side DC link signal Idc may be used to compensate RDSon for accurate current sensing and to perform diagnostic monitoring of RDSon and/or junction temperature, e.g., as previously described herein in connection with FIGS. 1 through 7.

Figure 9:
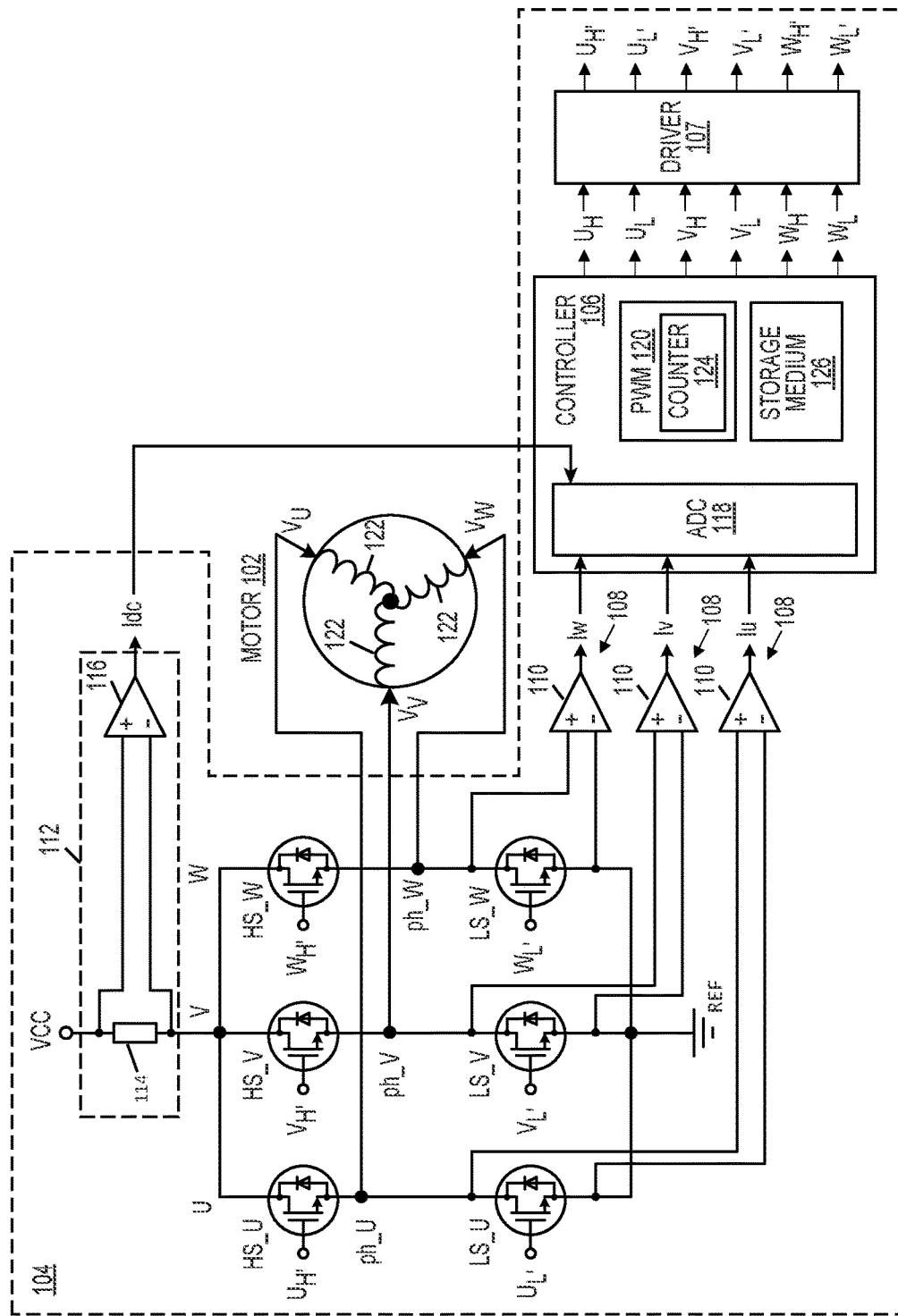
FIG. 9 illustrates a schematic diagram of an embodiment of a power electronic system that includes a multi-phase motor and a power conversion device that implements RDSon current sensing, according to another embodiment.

FIG. 9 illustrates another embodiment of the power electronic system 100. According to this embodiment, RDSon current sensing is implemented at the low-side switches LS_U, LS_V, LS_W and the single current sensor 112 connected between the voltage supply node VCC and the high-side switches HS_U, HS_V, HS_W. The reference node REF has no shunt or other current sensing element and may be a common ground with another electric circuit. The high-side DC link signal Idc may be used to compensate RDSon for accurate current sensing and to perform diagnostic monitoring of RDSon and/or junction temperature, e.g., as previously described herein in connection with FIGS. 1 through 7.

The ADC trigger position for RDSon compensation may be different than what is shown in FIGS. 3 and 5 through 7.

Figure 10:
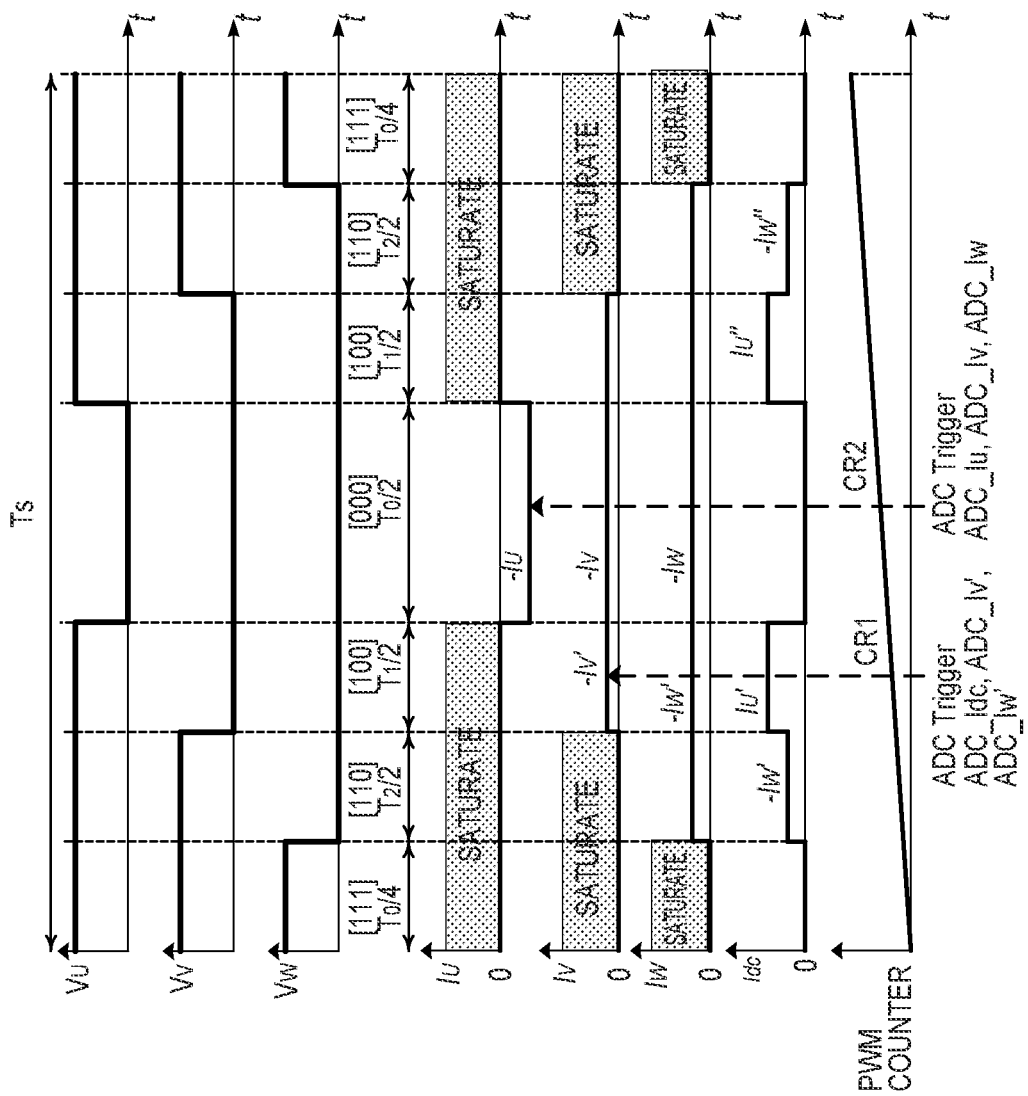
FIG. 10 illustrates a waveform diagram of the RDSon compensation implemented by the controller of the power conversion device of FIG. 1, 8 or 9 for 7-segment SVM-based PWM for one switching period in SVM sector A, as an example.

For example, FIG. 10 shows 7-segment SVM-based PWM for one switching period in SVM sector A, as an example. Instead of implementing ADC sampling at subperiod $T_2/T$ which corresponds to SVM switching state [110] for sampling Iw' and Idc, e.g., in case the time window for SVM switching state [110] is not wide enough for the ADC circuitry 118 to provide an accurate sample, the controller 106 may instead implement the ADC sampling at subperiod $T_1/T$ which corresponds to SVM switching state [100] for sampling Iv', Iw' and Idc. The controller 106 then calculates Iu'=−(Iv'+Iw') based on the motor current equation Iu+Iv+Iw=0. The compensation factor calculation is similar to what has been previously described, but Idc/Iu' (or Iu'/Idc) is used as the compensation factor to compensate for RDSon variations in leg U instead of the previous leg W RDSon variations.

As previously described herein, the RDSon current sensing technique may be implemented for various types of control techniques such as BLDC, PMSM, ACIM, etc. and control algorithms for sensorless or sensored FOC, sensorless or sensored DTC, sensorless or sensored BLDC block commutation control, etc.

Figure 11:
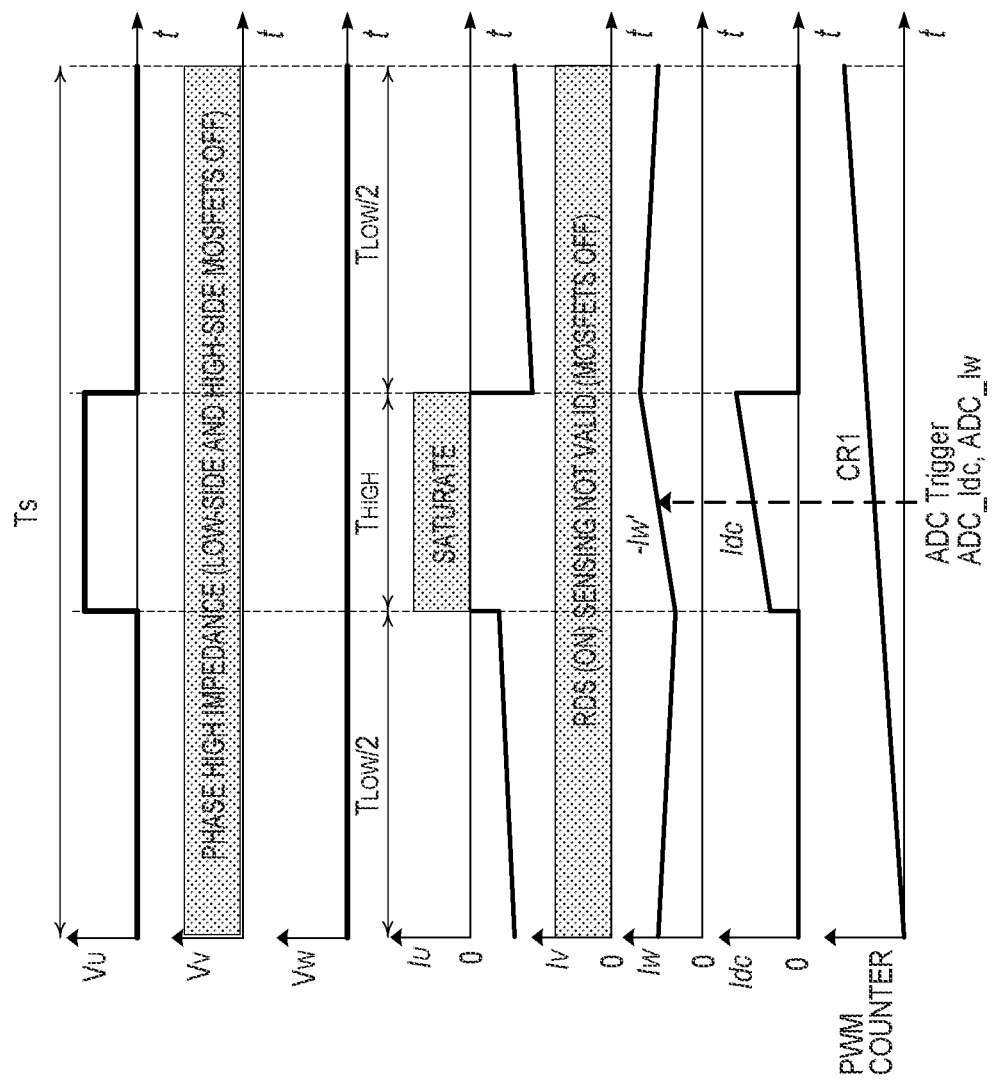
FIG. 11 illustrates a waveform diagram of the RDSon compensation technique as applied to sensorless or sensored BLDC block commutation control, according to an embodiment.

FIG. 11 illustrates an embodiment of the RDSon current sensing technique applied to sensorless or sensored BLDC block commutation control. In the context of the 3-phase motor embodiments shown in FIGS. 1, 8 and 9, typically two motor phases are energized and the third phase is floating (high-impedance) when the motor 102 is running.

For example, FIG. 11 shows one PWM switching period Ts with legs (phases) U and W energized while leg (phase) V is floating, e.g., Ts=50 μs for 20 kHz PWM. For this example, leg V is in a high-impedance state with both the high-side switch HS_V and the low-side switch LS_V of leg V being off. Leg W is in an energized state with the high-side switch HS_W of leg W being off and the low-side switch LS_W of leg W being on. Leg U is in an energized state with the high-side switch HS_U of leg U being on and the low-side switch LS_U of leg U being off.

Both the amplifier 110 for phase W and the amplifier 116 of the single current sensor 112 amplify the same motor current at the PWM subperiod THigh, where ADC samplings and conversions are triggered by the ADC circuitry 118 of the controller 106. The output of the amplifier 110 for phase W is affected by the phase W RDSon variations but the output of the amplifier 116 of the single current sensor 112 is accurate since the current sensing element 114 of the single current sensor 112 has less variation than the RDSon. Accordingly, the ratio of ADC values Iw/Idc, after factoring out amplifier gains and biases, is used to calculate the RDSon value for the corresponding switch LS_W/HS_W of leg W, e.g., RDSon of the low-side LS_W of leg W in accordance with:

$$R_{DSon\_W} = \frac{Iw}{Idc} \times R_{shunt} \quad (3)$$

where Rshunt is the resistance of the current sensing element 114 of the single current sensor 112 in the case of the current sensing element 114 being implemented as a shunt resistor.

The RDSon values for the other legs (phases) may be calculated in sensorless or sensored BLDC block commutation control, in a similar manner. The junction temperature of the individual switches HS_U, HS_V, HS_W, LS_U, LS_V, LS_W may be calculated according to the relationship between RDSon and Tj, also as previously described herein. If the RDSon or junction temperature are too high, e.g., due to high power loss or device damage/defect, then the system 100 may take appropriate action, e.g., by reducing the output power of the power conversion device 104 accordingly, reducing motor torque or speed, shutting the system down, etc.

Figure 12:
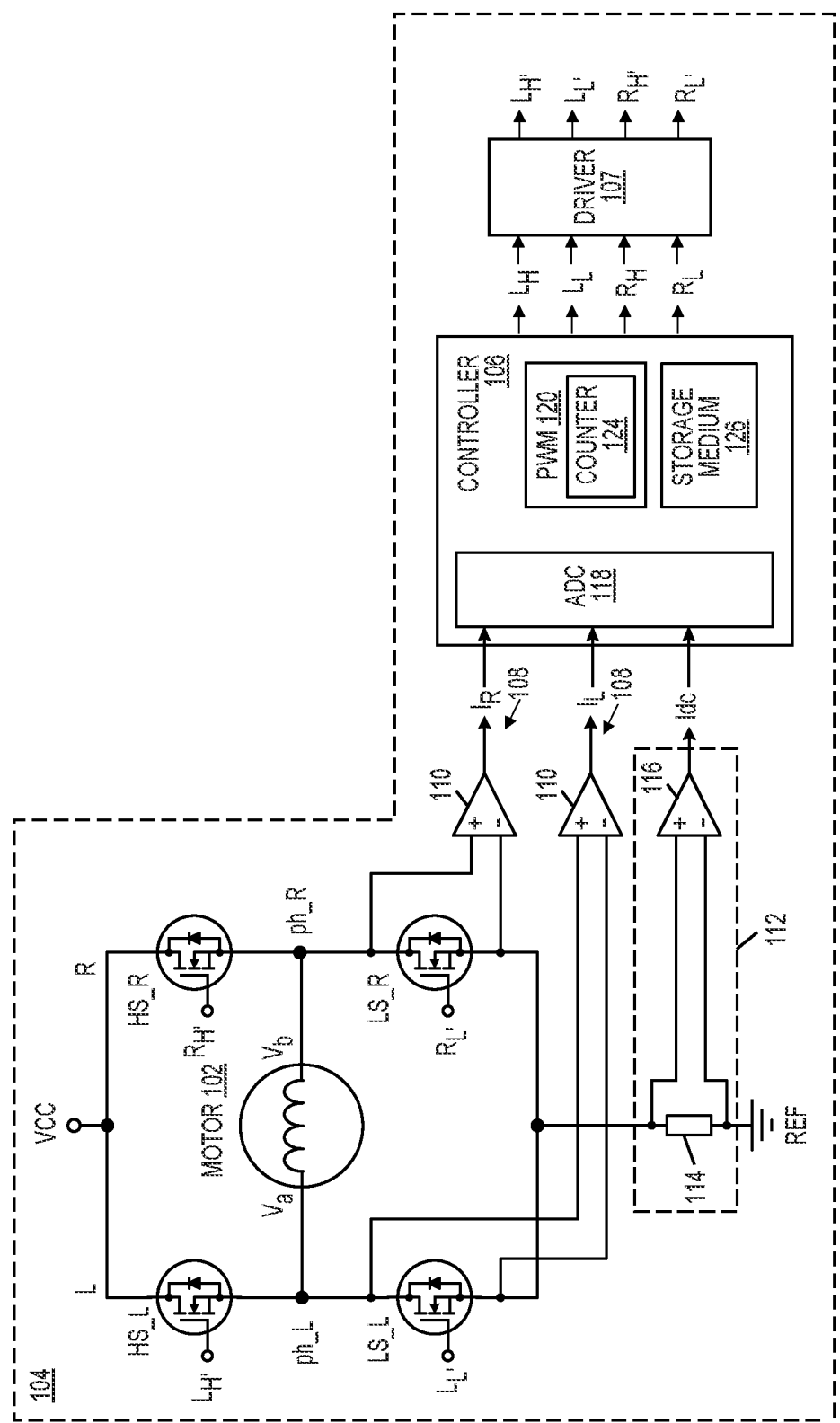
FIG. 12 illustrates a schematic diagram of an embodiment of a power electronic system that implements RDSon current sensing for H-bridge motor control.

FIG. 12 illustrates an embodiment of a power electronic system 200 that includes the power conversion device 104. The power conversion device 104 implements H-bridge motor control, e.g., for brushed/brushless/stepper motors 102. According to this embodiment, the power conversion device 104 has 2 legs (phases) L, R. The RDSon current sensing technique may be implemented for diagnostic monitoring of RDSon and/or junction temperature Tj.

Figure 13:
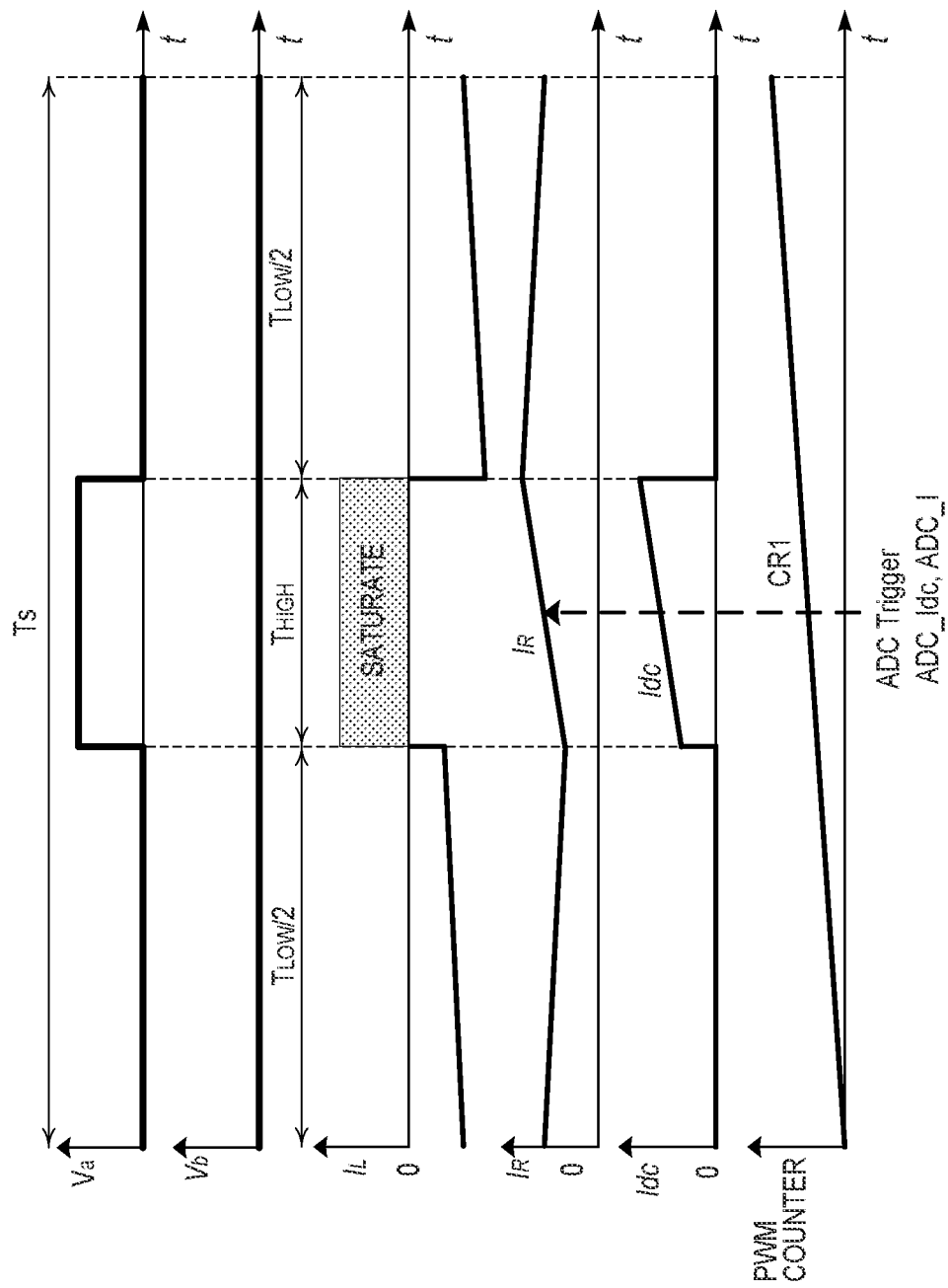
FIG. 13 illustrates a waveform diagram of the RDSon compensation implemented by the system of FIG. 12, as an example.

FIG. 13 illustrates the ADC triggering for the H-bridge motor control implementation shown in FIG. 12, as another implantation example. One switching period TS is shown in FIG. 13, along with the corresponding motor node voltages Va, Vb, the sensed leg currents IL, IR and the sensed DC link current Idc. The DC link current Idc sampled at CR1 may be used to implement diagnostic monitoring of RDSon and/or junction temperature Tj of the corresponding switch HS_L, HS_R, LS_L, LS_R. Based on the configuration shown in FIG. 12 and the switching period shown in FIG. 13, RDSon and/or junction temperature Tj of low-side switch LS_R is monitored.

Figure 14:
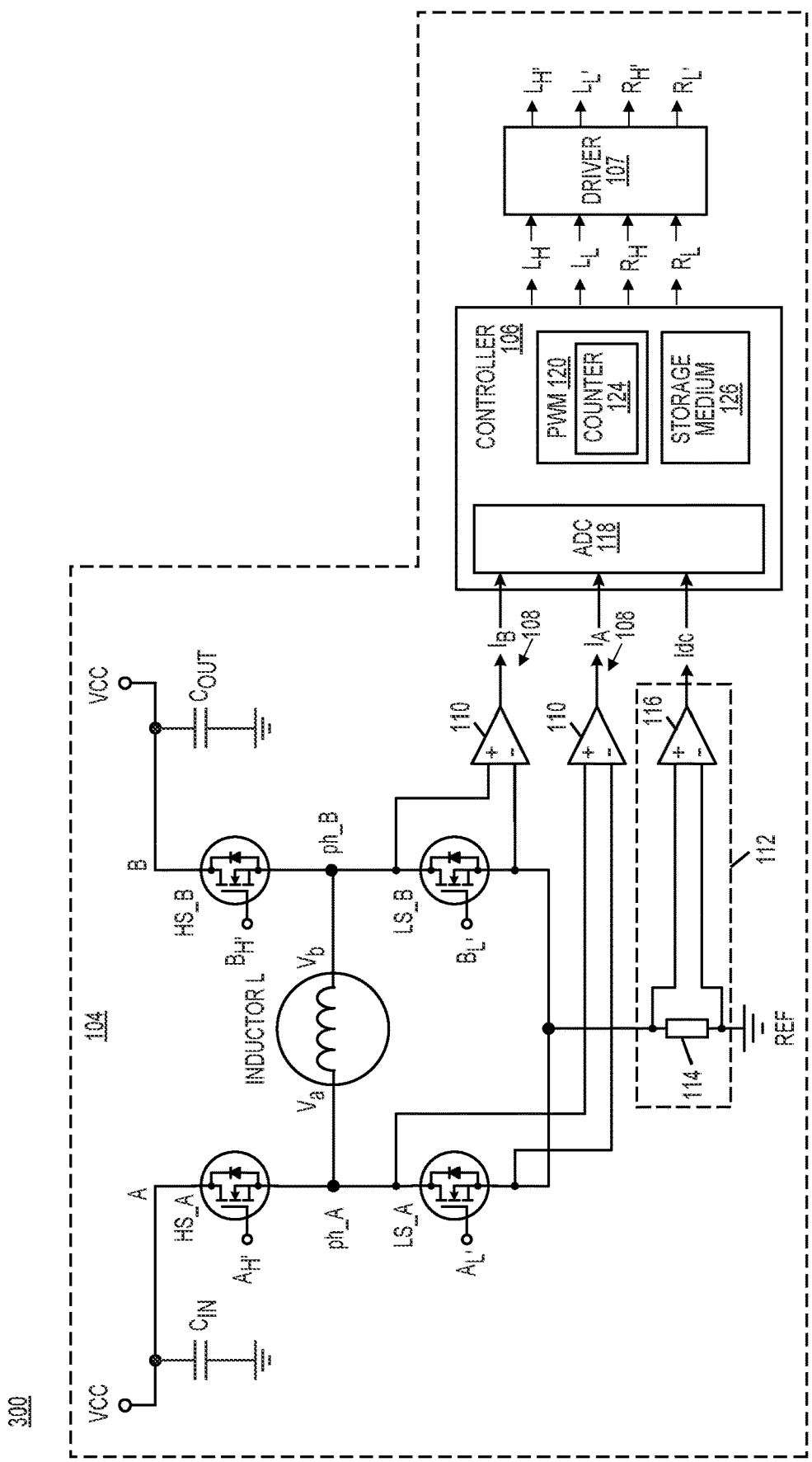
FIG. 14 illustrates a schematic diagram of an embodiment of a power electronic system that implements RDSon current sensing for buck-boost converter control.

FIG. 14 illustrates an embodiment of a power electronic system 300 that includes the power conversion device 104. The power conversion device 104 implements an H-bridge buck-boost converter, where the output voltage Vout has a magnitude that is either greater than (boost mode) or less than (buck mode) the magnitude of the input voltage Vin. According to this embodiment, the power conversion device 104 has 2 legs (phases) A, B. The RDSon current sensing technique may be implemented for diagnostic monitoring of RDSon and/or junction temperature Tj.

Figure 15:
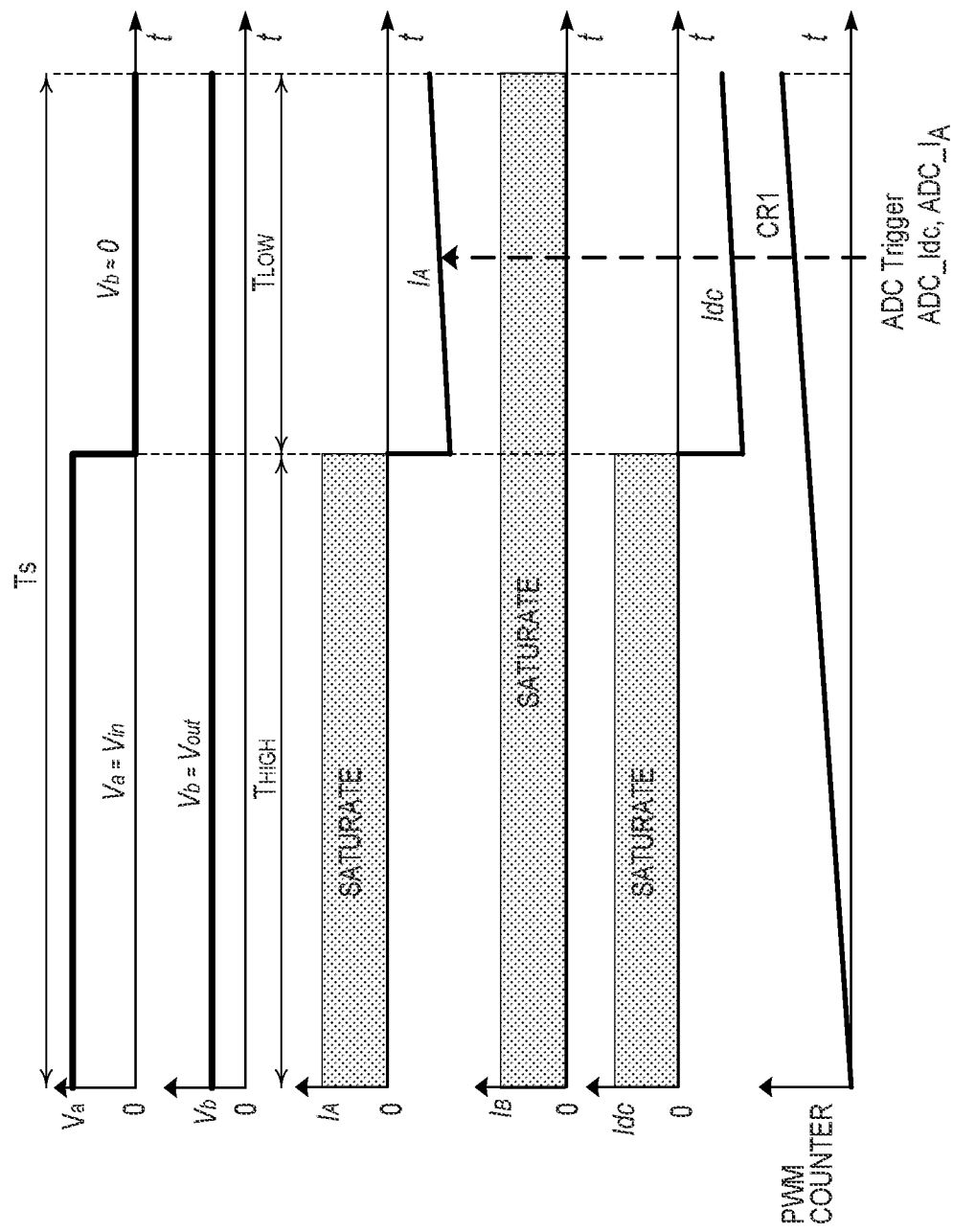
FIG. 15 illustrates a waveform diagram of the RDSon compensation implemented by the system of FIG. 14 in buck mode.
Figure 16:
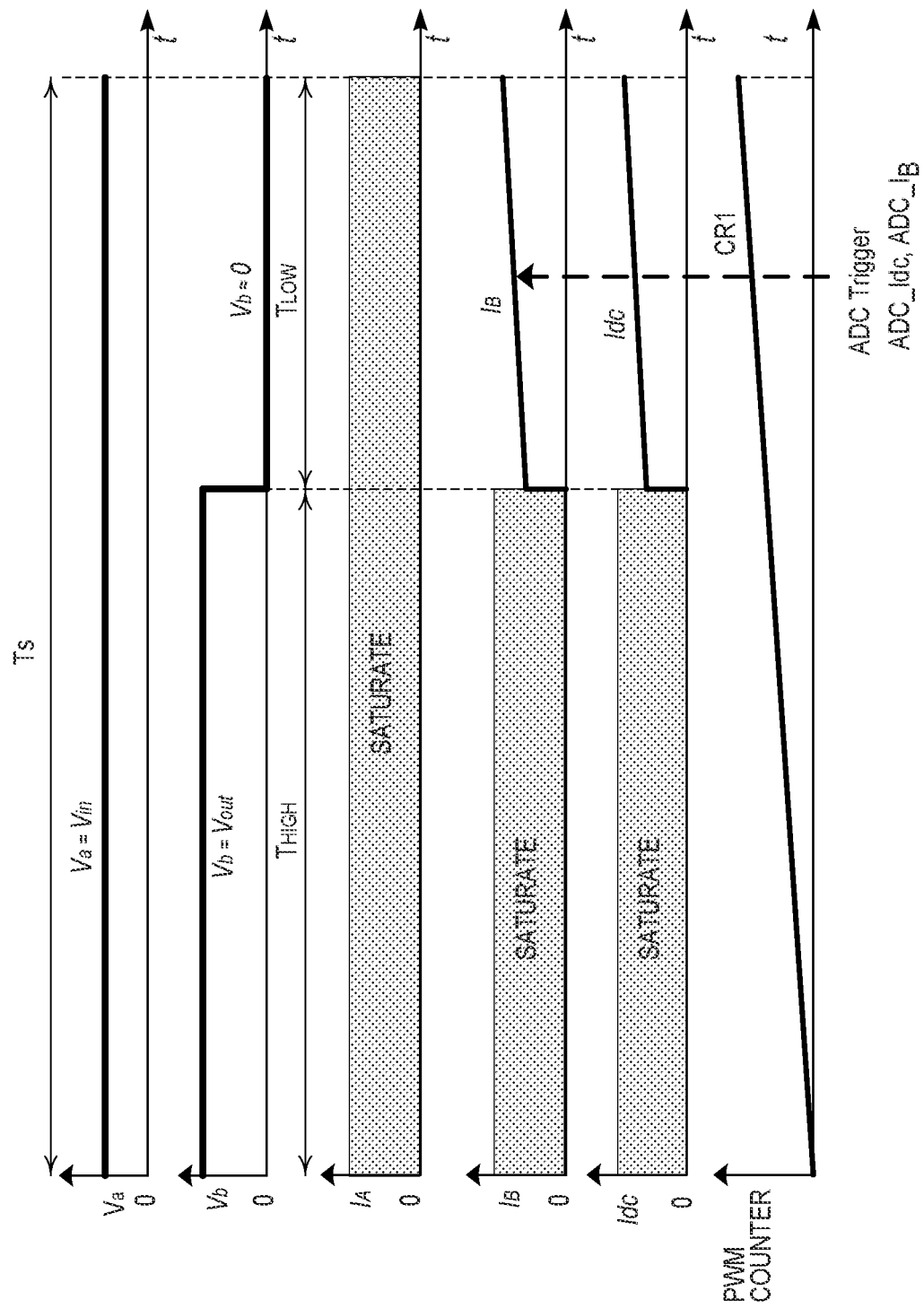
FIG. 16 illustrates a waveform diagram of the RDSon compensation implemented by the system of FIG. 14 in boost mode.

FIG. 15 illustrates the ADC triggering for the H-bridge buck-boost converter implementation shown in FIG. 14 in buck mode (Vin>Vout), as another implantation example. One switching period TS is shown in FIG. 15, along with the corresponding node voltages Va, Vb of the buck-boost inductor L, the sensed leg currents $I_A$, $I_B$ and the sensed DC link current Idc. The DC link current Idc sampled at CR1 may be used to implement diagnostic monitoring of RDSon and/or junction temperature Tj of the corresponding switch HS_A, HS_B, LS_A, LS_B. Based on the configuration shown in FIG. 14 and the switching period shown in FIG. 15, RDSon and/or junction temperature Tj of low-side switch LS_A is monitored. FIG. 16 illustrates the ADC triggering for the H-bridge buck-boost converter implementation shown in FIG. 14, but in boost mode (Vin<Vout) where RDSon and/or junction temperature Tj of low-side switch LS_B is monitored.

The RDSon current sensing technique described herein achieves low system cost and minimum system board size by reducing shunt resistor numbers but while still using transistor RDSon. The cost for changing design to three-shunt RDSon current sensing shown (e.g., used for sensored FOC or sensorless FOC) is minimized. The RDSon current sensing technique achieves low power loss on shunt resistor(s) compared with three-shunt or two-shunt current sensing (low-side or in-phase), especially at high power motor control applications such as power tools, gardening tools, eBikes, e-scooters, LEV, drones, etc. The RDSon current sensing technique allows for easier thermal design of the system. Fast RDSon compensation can be done, one phase compensation can be finished in one PWM cycle and three-phase compensation can be finished within one electrical revolution of the motor. The RDSon current sensing technique can be used for diagnostic monitoring of the transistor RDSon or junction temperature Tj for system protection in conditions of high transistor temperature, transistor damage/defect, or other purposes.

Although the present disclosure is not so limited, the following numbered examples demonstrate one or more aspects of the disclosure.

Example 1. A power conversion device, comprising: a plurality of legs, each leg comprising a high-side switch connected between a voltage supply node and a phase node and a low-side switch connected between the phase node and a reference node; a phase current sensor for each leg and configured to sense current flowing through the high-side switch or the low-side switch of the corresponding leg; a single current sensor connected between the reference node and the low-side switches, or between the voltage supply node and the high-side switches; and a controller, wherein during a subperiod of a switching period, the controller is configured to sample the current sensed by at least one of the phase current sensors and a current sensed by the single current sensor such that the current in one or more of the legs is sampled during the same subperiod as the current flowing through the single current sensor.

Example 2. The power conversion device of example 1, wherein the controller is configured to calculate a compensation factor based on the currents sampled during the same subperiod.

Example 3. The power conversion device of example 2, wherein during a different subperiod of the same switching period, the controller is configured to sample a phase current for one of the legs using the corresponding phase current sensor, and wherein the controller is configured to adjust the sampled phase current based on the compensation factor.

Example 4. The power conversion device of example 2 or 3, wherein during a subsequent switching period, the controller is configured to sample a phase current for one of the legs using the corresponding phase current sensor, and wherein the controller is configured to adjust the sampled phase current based on the compensation factor calculated during a previous switching period.

Example 5. The power conversion device of any of examples 2 through 4, wherein the controller is configured to perform diagnostic monitoring of one or more of the low-side switches and/or one or more of the high-side switches based on the compensation factor.

Example 6. The power conversion device of any of examples 2 through 5, wherein the controller is configured to calculate an on-state resistance of the high-side switch or the low-side switch connected to the phase current sensor that sampled current during the subperiod of the switching period, based on the currents sampled during the same subperiod.

Example 7. The power conversion device of example 6, wherein the controller is configured to calculate a junction temperature of the high-side switch or the low-side switch connected to the phase current sensor that sampled current during the first subperiod of the switching period, based on the calculated on-state resistance and a predefined relationship between on-state resistance and junction temperature.

Example 8. The power conversion device of example 7, wherein the controller is configured to take one or more corrective actions responsive to the calculated on-state resistance or the calculated junction temperature exceeding one or more corresponding thresholds.

Example 9. The power conversion device of any of examples 2 through 8, wherein the controller is configured to calculate the compensation factor as a single point calculation.

Example 10. The power conversion device of any of examples 2 through 8, wherein the controller is configured to calculate the compensation factor over several consecutive switching periods and/or based on a plurality of sample points.

Example 11. The power conversion device of example 10, wherein the controller is configured to apply a moving average or a digital filter to the plurality of sample points to calculate the compensation factor.

Example 12. The power conversion device of any of examples 1 through 11, wherein: the power conversion device has three legs; the low-side switch of a first one of the three legs is on and the high-side switch of the first one of the three legs is off during the subperiod of the switching period; the low-side switch of a second one and a third one of the three legs is off and the high-side switch of the second one of the three legs and the third one of the three legs is on during the subperiod of the switching period; each phase current sensor is connected across the low-side switch of the corresponding leg; the single current sensor is connected between the reference node and the low-side switches; and during the subperiod of the switching period, the controller is configured to sample the current sensed by the phase current sensor electrically coupled across the low-side switch of the first one of the three legs and the current sensed by the single current sensor such that the current in the first one of the three legs is sampled during the same subperiod as the current flowing through the single current sensor.

Example 13. The power conversion device of example 12, wherein the controller is configured to calculate a ratio of the current sensed by the single current sensor during the subperiod of the switching period and the current sensed by the phase current sensor electrically coupled across the low-side switch of the first one of the three legs during the subperiod of the switching period.

Example 14. The power conversion device of example 13, wherein during a different subperiod of the same switching period, the controller is configured to sample a phase current for one of the legs using the corresponding phase current sensor, and wherein the controller is configured to multiply the phase current sampled during the different subperiod by the ratio.

Example 15. The power conversion device of any of examples 1 through 14, wherein the controller is configured to implement a modulation technique that defines a plurality of switching and zero voltage vectors, each switching voltage vector defining a state in which an output voltage of the power conversion device has non-zero magnitude and phase and the zero voltage vectors defining a state in which the output voltage has zero magnitude and phase, and wherein the controller is configured to sample the currents sensed by at least one of the phase current sensors and by the single current sensor during one or more of the switching states of the switching period.

Example 16. The power conversion device of example 15, wherein the controller is configured to calculate a compensation factor based on the currents sampled during each switching state of the switching period.

Example 17. The power conversion device of example 15 or 16, wherein the controller is configured to sample the currents sensed by at least one of the phase current sensors and by the single current sensor during a switching state of the switching period having a window size that exceeds a predefined minimum size.

Example 18. The power conversion device of any of examples 1 through 17, wherein during the subperiod of the switching period: a first one of the legs is in a high-impedance state with both the high-side switch and the low-side switch of the leg being off; a second one of the legs is in an energized state with the high-side switch of the leg being off and the low-side switch of the leg being on; each remaining one of the legs is in an energized state with the high-side switch of the leg being on and the low-side switch of the leg being off; the controller is configured to sample a first current sensed by the phase current sensor for the second one of the legs and a second current sensed by the single current sensor, and calculate an on-state resistance of the low-side switch of the second one of the legs based on the sampled first and second currents.

Example 19. The power conversion device of example 18, wherein the controller is configured to calculate a junction temperature of the low-side switch of the second one of the legs, based on the calculated on-state resistance of the low-side switch of the second one of the legs and a predefined relationship between on-state resistance and junction temperature.

Example 20. The power conversion device of example 19, wherein the controller is configured to take one or more corrective actions responsive to the calculated on-state resistance or the calculated junction temperature exceeding one or more corresponding thresholds.

Example 21. The power conversion device of any of examples 1 through 20, wherein the controller comprises a plurality of sampling units, and wherein the controller is configured to simultaneously sample the current sensed by at least one of the phase current sensors and the current sensed by the single current sensor during the same subperiod by using the plurality of sampling units.

Example 22. The power conversion device of any of examples 1 through 20, wherein the controller comprises a sampling unit, and wherein the controller is configured to successively sample the current sensed by at least one of the phase current sensors and the current sensed by the single current sensor during the same subperiod by using the same sampling unit.

Example 23. A power electronic system, comprising: a multi-phase motor; and a power conversion device configured to drive the multi-phase motor and comprising: a plurality of legs, each leg comprising a high-side switch connected between a voltage supply node and a phase node coupled to the multi-phase motor and a low-side switch connected between the phase node and a reference node; a phase current sensor for each leg and configured to sense current flowing through the high-side switch or the low-side switch of the corresponding leg during operation of the multi-phase motor; a single current sensor connected between the reference node and the low-side switches, or between the voltage supply node and the high-side switches; and a controller, wherein during a subperiod of a switching period for driving the multi-phase motor, the controller is configured to sample the current sensed by at least one of the phase current sensors and a current sensed by the single current sensor such that the current in one or more of the legs is sampled during the same subperiod as the current flowing through the single current sensor.

Example 24. The power electronic system of example 23, wherein the controller is configured to calculate a compensation factor based on the currents sampled during the same subperiod.

Example 25. The power electronic system of example 23 or 24, wherein during a different subperiod of the same switching period, the controller is configured to sample a phase current delivered to the multi-phase motor by one of the legs using the corresponding phase current sensor, and wherein the controller is configured to adjust the sampled phase current based on the compensation factor.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power conversion device, comprising:
a plurality of legs, each leg comprising a high-side switch connected between a voltage supply node and a phase node and a low-side switch connected between the phase node and a reference node;
a phase current sensor for each leg and configured to sense current flowing through the high-side switch or the low-side switch of the corresponding leg;
a single current sensor connected between the reference node and the low-side switches, or between the voltage supply node and the high-side switches; and
a controller,
wherein during a subperiod of a switching period, the controller is configured to sample the current sensed by at least one of the phase current sensors and a current sensed by the single current sensor such that the current in one or more of the legs and the current flowing through the single current sensor are sampled during the subperiod.

2. The power conversion device of claim 1, wherein the controller is configured to calculate a compensation factor based on the currents sampled during the subperiod.

3. The power conversion device of claim 2, wherein during a different subperiod of the switching period, the controller is configured to sample a phase current for one of the legs using the corresponding phase current sensor, and wherein the controller is configured to adjust the sampled phase current based on the compensation factor.

4. The power conversion device of claim 2, wherein during a subsequent switching period, the controller is configured to sample a phase current for one of the legs using the phase current sensor for that leg, and wherein the controller is configured to adjust the sampled phase current based on the compensation factor calculated during a previous switching period.

5. The power conversion device of claim 2, wherein the controller is configured to perform diagnostic monitoring of one or more of the low-side switches and/or one or more of the high-side switches based on the compensation factor.

6. The power conversion device of claim 2, wherein the controller is configured to calculate an on-state resistance of the high-side switch or the low-side switch connected to the phase current sensor that sampled current during the subperiod of the switching period, based on the currents sampled during the subperiod.

7. The power conversion device of claim 6, wherein the controller is configured to calculate a junction temperature of the high-side switch or the low-side switch connected to the phase current sensor that sampled current during the subperiod of the switching period, based on the calculated on-state resistance and a predefined relationship between on-state resistance and junction temperature.

8. The power conversion device of claim 7, wherein the controller is configured to reduce an output power of the power conversion device responsive to the calculated on-state resistance or the calculated junction temperature exceeding one or more corresponding thresholds.

9. The power conversion device of claim 2, wherein the controller is configured to calculate the compensation factor as a single point calculation.

10. The power conversion device of claim 2, wherein the controller is configured to calculate the compensation factor over a plurality of consecutive switching periods and/or based on a plurality of sample points.

11. The power conversion device of claim 10, wherein the controller is configured to apply a moving average or a digital filter to the plurality of sample points to calculate the compensation factor.

12. The power conversion device of claim 1, wherein:
the power conversion device has three legs;
the low-side switch of a first one of the three legs is on and the high-side switch of the first one of the three legs is off during the subperiod of the switching period;
the low-side switch of a second one and a third one of the three legs is off and the high-side switch of the second one of the three legs and the third one of the three legs is on during the subperiod of the switching period;
each phase current sensor is connected across the low-side switch of the corresponding leg;
the single current sensor is connected between the reference node and the low-side switches; and
during the subperiod of the switching period, the controller is configured to sample the current sensed by the phase current sensor electrically coupled across the low-side switch of the first one of the three legs and the current sensed by the single current sensor such that the current in the first one of the three legs and the current flowing through the single current sensor are sampled during the subperiod.

13. The power conversion device of claim 12, wherein the controller is configured to calculate a ratio of the current sensed by the single current sensor during the subperiod of the switching period and the current sensed by the phase current sensor electrically coupled across the low-side switch of the first one of the three legs during the subperiod of the switching period.

14. The power conversion device of claim 13, wherein during a different subperiod of the switching period, the controller is configured to sample a phase current for one of the legs using the corresponding phase current sensor, and wherein the controller is configured to multiply the phase current sampled during the different subperiod by the ratio.

15. The power conversion device of claim 1, wherein the controller is configured to implement a modulation technique that defines a plurality of switching and zero voltage vectors, each switching voltage vector defining a state in which an output voltage of the power conversion device has non-zero magnitude and phase and the zero voltage vectors defining a state in which the output voltage has zero magnitude and phase, and wherein the controller is configured to sample the currents sensed by at least one of the phase current sensors and by the single current sensor during one or more of the states.

16. The power conversion device of claim 15, wherein the controller is configured to calculate a compensation factor based on the currents sampled during each switching state of the switching period.

17. The power conversion device of claim 15, wherein the controller is configured to sample the currents sensed by at least one of the phase current sensors and by the single current sensor during a switching state of the switching period having a window size that exceeds a predefined minimum size.

18. The power conversion device of claim 1, wherein during the subperiod of the switching period:
a first one of the legs is in a high-impedance state with both the high-side switch and the low-side switch of the leg being off;
a second one of the legs is in an energized state with the high-side switch of the leg being off and the low-side switch of the leg being on;
each remaining one of the legs is in an energized state with the high-side switch of the leg being on and the low-side switch of the leg being off;
the controller is configured to sample a first current sensed by the phase current sensor for the second one of the legs and a second current sensed by the single current sensor, and calculate an on-state resistance of the low-side switch of the second one of the legs based on the sampled first and second currents.

19. The power conversion device of claim 18, wherein the controller is configured to calculate a junction temperature of the low-side switch of the second one of the legs, based on the calculated on-state resistance of the low-side switch of the second one of the legs and a predefined relationship between on-state resistance and junction temperature.

20. The power conversion device of claim 19, wherein the controller is configured to take one or more corrective actions responsive to the calculated on-state resistance or the calculated junction temperature exceeding one or more corresponding thresholds.

21. The power conversion device of claim 1, wherein the controller comprises a plurality of sampling units, and wherein the controller is configured to simultaneously sample the current sensed by at least one of the phase current sensors and the current sensed by the single current sensor during the subperiod by using the plurality of sampling units.

22. The power conversion device of claim 1, wherein the controller comprises a sampling unit, and wherein the controller is configured to successively sample the current sensed by at least one of the phase current sensors and the current sensed by the single current sensor during the subperiod by using the same sampling unit.

23. A power electronic system, comprising:
a multi-phase motor; and
a power conversion device configured to drive the multi-phase motor and comprising:
a plurality of legs, each leg comprising a high-side switch connected between a voltage supply node and a phase node coupled to the multi-phase motor and a low-side switch connected between the phase node and a reference node;
a phase current sensor for each leg and configured to sense current flowing through the high-side switch or the low-side switch of the corresponding leg during operation of the multi-phase motor;
a single current sensor connected between the reference node and the low-side switches, or between the voltage supply node and the high-side switches; and
a controller,
wherein during a subperiod of a switching period for driving the multi-phase motor, the controller is configured to sample the current sensed by at least one of the phase current sensors and a current sensed by the single current sensor such that the current in one or more of the legs and the current flowing through the single current sensor are sampled during the subperiod.

24. The power electronic system of claim 23, wherein the controller is configured to calculate a compensation factor based on the currents sampled during the subperiod.

25. The power electronic system of claim 23, wherein during a different subperiod of the switching period, the controller is configured to sample a phase current delivered to the multi-phase motor by one of the legs using the corresponding phase current sensor, and wherein the controller is configured to adjust the sampled phase current based on the compensation factor.

* * * * *